(12) United States Patent
Datta et al.

(10) Patent No.: US 10,141,437 B2
(45) Date of Patent: *Nov. 27, 2018

(54) EXTREME HIGH MOBILITY CMOS LOGIC

(71) Applicant: Intel Corporation, Stanta Clara, CA (US)

(72) Inventors: Suman Datta, Beaverton, OR (US); Mantu K. Hudait, Portland, OR (US); Mark L. Doczy, Beaverton, OR (US); Jack T. Kavalieros, Portland, OR (US); Amlan Majumdar, Portland, OR (US); Justin K. Brask, Portland, OR (US); Been-Yih Jin, Lake Oswego, OR (US); Matthew V. Metz, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/626,067

(22) Filed: Jun. 16, 2017

(65) Prior Publication Data

US 2017/0309734 A1   Oct. 26, 2017

Related U.S. Application Data

(60) Continuation of application No. 14/977,479, filed on Dec. 21, 2015, now Pat. No. 9,691,856, which is a
(Continued)

(51) Int. Cl.
*H01L 29/778* (2006.01)
*H01L 29/15* (2006.01)
(Continued)

(52) U.S. Cl.
CPC ........ *H01L 29/7784* (2013.01); *H01L 27/092* (2013.01); *H01L 29/157* (2013.01);
(Continued)

(58) Field of Classification Search
CPC .................................................. H01L 29/7784
See application file for complete search history.

(56) References Cited

U.S. PATENT DOCUMENTS

| 4,751,201 A | 6/1988 | Nottenburg et al. |
| 4,871,692 A | 10/1989 | Lee et al. |

(Continued)

FOREIGN PATENT DOCUMENTS

| EP | 0 265 314 A1 | 4/1988 |
| EP | 0 469 604 A2 | 2/1992 |

(Continued)

OTHER PUBLICATIONS

K.Y. Park et al. Device Characteristics of AlGaN/GaN MIS-HFET Using Al2O3—HfO3 Laminated High-K Dielectric, Japan Journ of Appl. Phys., vol. 43, 2004, pp. L1433-L1435.

(Continued)

*Primary Examiner* — Jose R Diaz
(74) *Attorney, Agent, or Firm* — Schwabe, Williamson & Wyatt, P.C.

(57) ABSTRACT

A CMOS device includes a PMOS transistor with a first quantum well structure and an NMOS device with a second quantum well structure. The PMOS and NMOS transistors are formed on a substrate.

18 Claims, 25 Drawing Sheets

Related U.S. Application Data continuation of application No. 14/302,371, filed on Jun. 11, 2014, now Pat. No. 9,548,363, which is a continuation of application No. 13/962,890, filed on Aug. 8, 2013, now Pat. No. 8,802,517, which is a continuation of application No. 13/450,359, filed on Apr. 18, 2012, now Pat. No. 8,518,768, which is a division of application No. 11/305,452, filed on Dec. 15, 2005, now Pat. No. 8,183,556.

(51) Int. Cl.
- H01L 29/205 (2006.01)
- H01L 29/51 (2006.01)
- H01L 27/092 (2006.01)
- H01L 29/66 (2006.01)

(52) U.S. Cl.
CPC .......... *H01L 29/205* (2013.01); *H01L 29/517* (2013.01); *H01L 29/66462* (2013.01)

(56) References Cited

U.S. PATENT DOCUMENTS

| | | | |
|---|---|---|---|
| 4,872,046 | A | 10/1989 | Morkoc et al. |
| 4,914,059 | A | 4/1990 | Nissim et al. |
| 5,144,378 | A | 9/1992 | Hikosaka |
| 5,298,441 | A | 3/1994 | Goronkin et al. |
| 5,334,865 | A | 8/1994 | Fathimulla et al. |
| 5,357,119 | A | 10/1994 | Wang et al. |
| 5,479,033 | A | 12/1995 | Baca et al. |
| 5,495,115 | A | 2/1996 | Kudo et al. |
| 5,652,454 | A | 7/1997 | Iwamatsu et al. |
| 5,883,564 | A | 3/1999 | Partin |
| 5,981,400 | A | 11/1999 | Lo |
| 6,031,249 | A | 2/2000 | Yamazaki et al. |
| 6,117,697 | A | 9/2000 | Seaford et al. |
| 6,133,593 | A | 10/2000 | Boos et al. |
| 6,150,222 | A | 11/2000 | Gardner et al. |
| 6,190,975 | B1 | 2/2001 | Kubo et al. |
| 6,222,210 | B1 | 4/2001 | Cerny et al. |
| 6,252,262 | B1 | 6/2001 | Jonker et al. |
| 6,310,367 | B1 | 10/2001 | Yagishita et al. |
| 6,320,212 | B1 | 11/2001 | Chow |
| 6,399,970 | B2 | 6/2002 | Kubo et al. |
| 6,403,434 | B1 | 6/2002 | Yu |
| 6,406,795 | B1 | 6/2002 | Hwang |
| 6,407,442 | B2 | 6/2002 | Inoue et al. |
| 6,458,662 | B1 | 10/2002 | Yu |
| 6,607,948 | B1 | 8/2003 | Sugiyama et al. |
| 6,686,231 | B1 | 2/2004 | Ahmed et al. |
| 6,762,469 | B2 | 7/2004 | Mocuta et al. |
| 7,154,118 | B2 | 12/2006 | Lindert |
| 7,235,822 | B2 | 6/2007 | Li |
| 7,485,503 | B2 | 2/2009 | Brask et al. |
| 7,573,059 | B2 | 8/2009 | Hudait et al. |
| 8,802,517 | B2 * | 8/2014 | Datta .............. H01L 21/823807 257/14 |
| 9,548,363 | B2 * | 1/2017 | Datta .............. H01L 21/823807 |
| 9,691,856 | B2 * | 6/2017 | Datta .............. H01L 21/823807 |
| 2002/0093332 | A1 | 7/2002 | Schroeder et al. |
| 2002/0096724 | A1 | 7/2002 | Liang et al. |
| 2002/0160553 | A1 | 10/2002 | Yamanaka et al. |
| 2002/0185655 | A1 | 12/2002 | Fathimulla et al. |
| 2003/0057477 | A1 | 3/2003 | Hergenrother et al. |
| 2003/0080332 | A1 | 5/2003 | Phillips |
| 2003/0227036 | A1 | 12/2003 | Sugiyama |
| 2004/0031979 | A1 | 2/2004 | Lochtefield et al. |
| 2004/0075149 | A1 | 4/2004 | Fitzgerald et al. |
| 2004/0099966 | A1 | 5/2004 | Chau et al. |
| 2004/0219711 | A1 | 11/2004 | Pham et al. |
| 2004/0227187 | A1 | 11/2004 | Cheng et al. |
| 2004/0238842 | A1 | 12/2004 | Micovic et al. |
| 2005/0040429 | A1 | 2/2005 | Uppal |
| 2005/0062082 | A1 | 3/2005 | Bucher et al. |
| 2005/0145944 | A1 | 7/2005 | Murthy et al. |
| 2005/0224800 | A1 | 10/2005 | Lindert et al. |
| 2005/0285098 | A1 | 12/2005 | Fathmulla et al. |
| 2005/0287752 | A1 | 12/2005 | Nouri et al. |
| 2006/0148182 | A1 | 7/2006 | Datta et al. |
| 2006/0172480 | A1 | 8/2006 | Wang et al. |
| 2007/0001219 | A1 | 1/2007 | Radosvljevic et al. |
| 2007/0069302 | A1 | 3/2007 | Jin |
| 2007/0090416 | A1 | 4/2007 | Doyle |
| 2008/0032478 | A1 | 2/2008 | Hudait et al. |

FOREIGN PATENT DOCUMENTS

| | | |
|---|---|---|
| EP | 0 474 952 A1 | 3/1992 |
| JP | 05 090242 A | 4/1993 |
| JP | 06 132521 | 5/1994 |
| JP | 2005085916 A | 3/2005 |
| WO | WO 91/06976 | 5/1991 |

OTHER PUBLICATIONS

H.W. Jang et al. "Incorporation of Oxygen Donors in AlGaN", J. Electronchem Soc. 152, pp. G536-G540, (2004).

Bednyl et al. "Electronic State of the Surface of INP Modified by Treatment in Sulfur Vapor" Soviet Physics Semiconductors, Am. Inst. of Physics, New York, vol. 26, No. 8, Aug. 1, 1992.

Datta et al. "85mm Gate Length Enhancement and Depletion Mode InSb Quantum Well Transistors for Ultra High Speed and Very Low Power Digital Logic Applications" IEEE Dec. 5, 2005, pp. 763-766.

Ashley et al. "InSb-Based Quantum Well Transistors for High Speed, Low Power Applications", QinetiQ, Malvern Technology Center and Intel (2004), 2 pages.

PCT Search Report PCT/US2006/044601, dated Mar. 19, 2007, 7 pages.

Buchanan, D.A. "Fabrication of Midgap Metal Gates Compatible with Ultrathin Dielectrics", Applied Physics Letters 73.12 (1998), pp. 1676-1678.

Claflin, B. "Interface Studies of Tungsten Nitride and Titanium Nitride Composite Metal Gate Electrodes with Thin Dielectric Layers", Journal of Vacuum Science and Technology, A 16.3 (1998), pp. 1757-1761.

Hwang, Jeong-Mo, "Novel Polysilicon/TiN Stacked Gate Structure for Fully Depleted SOI/CMOS", International Electronic Devices Meeting Technical Digest (1992), pp. 345-348.

Jin, B. et al., "Mobility Enhancement in Compressively Strained SIGE Surface Channel PMOS Transistors with HF02/TIN Gate Stack", Proceedings of the First Joint International Symposium, 206th Meeting of Electrochemical Society, Oct. 2004, pp. 111-122.

Chau, R., "Advanced Metal Gate/High-K Dielectric Stacks for High-Performance CMOS Transistors", Proceedings of AVS 5th International Conference of Microelectronics and Interfaces, Mar. 2004, (3 pgs.).

Nowak, Edward J. et al., "Turning Silicon on Its Edge," IEEE Circuits & Devices Magazine, vol. 1, (Jan./Feb. 2004), pp. 20-31.

M. Mori et al., "Heteroepitaxial Growth of InSb films on a Si(001) Substrate via AlSb Buffer Layer", Applied Surface Science 216 (2003), pp. 569-574.

A. Wan et al., "Characterization of GaAs Grown by Molecular Beam Epitaxy on Vicinal Ge (100) Substrates", J. Vac. Sci. Technol. B 22(4) Jul./Aug. 2004, pp. 1893-1897.

R.M. Sieg et al., "Toward Device-Quality GaAs Growth by Molecular Beam Epitaxy on Offcut Ge/SiGe/Si Substrates", J. Vac. Sci. Technol. B 16(3) May/Jun. 1998, pp. 1471-1474.

Scholz et al., "MOVPE Growth of GaAs on Ge Substrates by Inserting a Thin Low Temperature Buffer Layer", Cryst. Res. Technol. 41, No. 2 (2006), pp. 111-116.

Passlack et al., "Self-Aligned GaAs p-Channel Enhancement Mode MOS Heterostructure Field-Effect Transistor", IEEE Electron Device Letters, vol. 23, No. 9, Sep. 2002, pp. 508-510.

V.N. Bessolov et al., "Chalcogenide Passivation of III-V Semiconductor Surfaces", 1998 American Institute of Physics, Semiconductors 32 (11), Nov. 1998.

(56) References Cited

OTHER PUBLICATIONS

K.Y. Park et al., "Device Charateristics of AlGaN/GaN MIS-HFET Using Al2O3—HfO2 Laminated High-k Dielectric", Japanese Journal of Applied Physics, vol. 43, No. 11A, 2004, pp. L1433-L1435.
Ashley et al., "High-Speed, Low-Pressure InSb Transistors", 1997 IEEE, IEDM 97-751, pp. 30.4.1-30.4.4.
B.A. Kuruvilla et al., "Passivation of GaAs (100) using Selenium Sulfide", 1993 American Institute of Physics, J. Appl. Phys. 73 (9), May 1, 1993, pp. 4384-4387.
D. Mistele et al., "Incorporation of Dielectric Layers into the Processing of III-Nitride-Based Heterostructure Field-Effect Transistors", Journal of Electronic Materials, vol. 32, No. 5, 2003, pp. 355-363.
B.I. Bednyl et al., "Electronic State of the Surface of InP Modified by Treatment in Sulfur Vapor", 1992 American Institute of Physics, Sov. Phys. Semicond. 26(8), Aug. 1992.
C. Gonzalez et al., "Selenium Passivation of GaAs(001): A Combined Experimental and Theoretical Study", Institute of Physics Publishing, Journal of Physics Condensed Matter, J. Phys.: Condens. Matter 16 (2004), pp. 2187-2206.
Frank et al., HfO2 and Al2O3 Dielectrics GaAs Grown by Atomic Layer Deposition, Applied Physics Letters, vol. 86, Issue 15, id. 152904, 2005, 1 page.
T. Sugizaki et al., "Novel Multi-bit SONOS Type Flash Memory Using a High-k Charge Trapping Layer" 2003 Symposium on VLSI Technology Digest of Technical Papers, pp. 27-28.
G. Balakrishnan et al., "Room-Temperature Optically-Pumped GaSb Quantum Well Based VCSEL Monolithically Grown on Si (100) Substrate", Electronic Letters Mar. 16, 2006, vol. 42, No. 6, 2 pages.
T. Nguyen et al., "Growth of Heteroepitaxial GaSb Thin Films on Si(100) Substrates", J. Mater. Res., Materials Research Society, vol. 19, No. 8, Aug. 2004, pp. 2315-2321.
Office Communication dated Feb. 9, 2009, U.S. Appl. No. 11/305,452.
Office Communication dated Nov. 13, 2009, U.S. Appl. No. 11/305,452.
Office Communication dated Aug. 4, 2010, U.S. Appl. No. 11/305,452.
Office Communication dated Jan. 21, 2011, U.S. Appl. No. 11/305,452.
Office Communication dated Aug. 3, 2011, U.S. Appl. No. 11/305,452.

\* cited by examiner

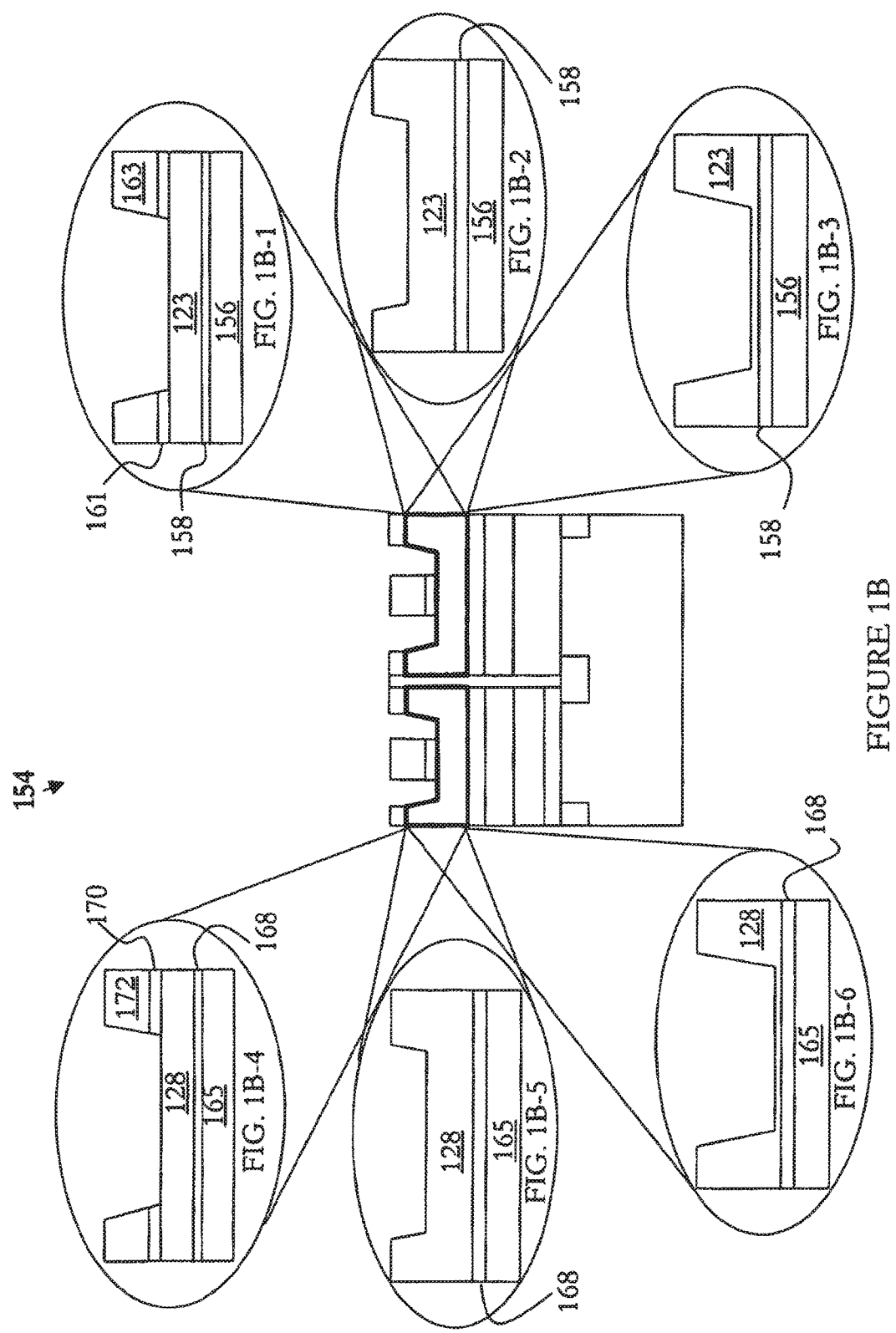

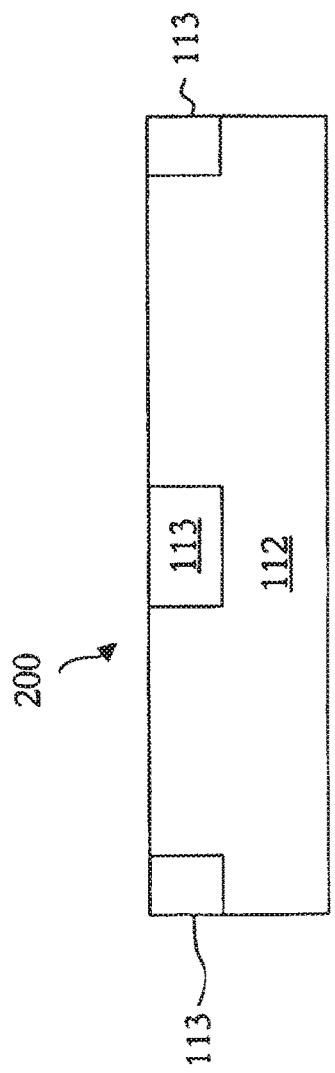
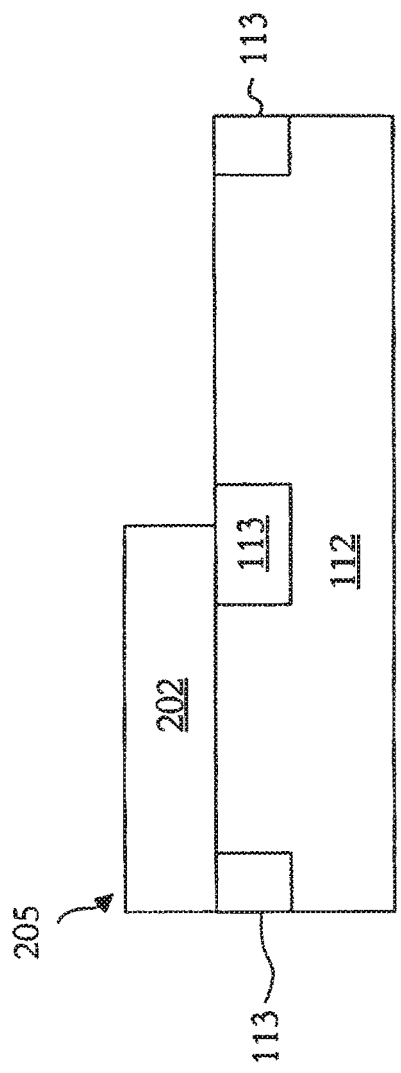

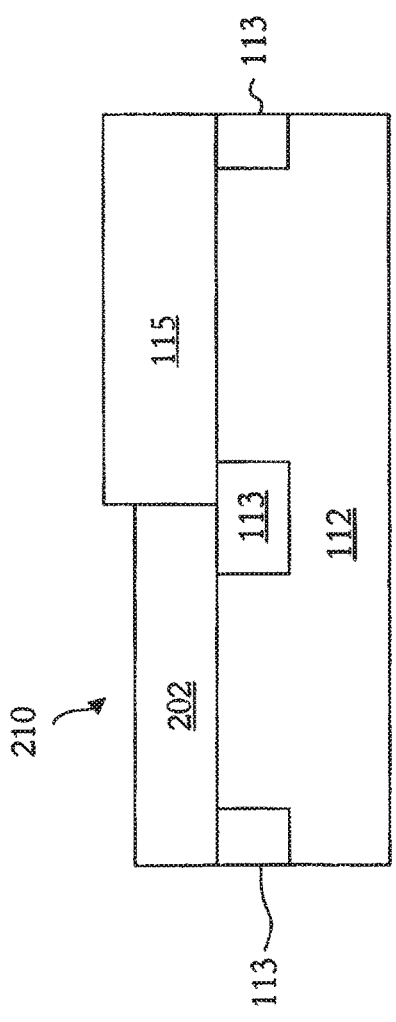
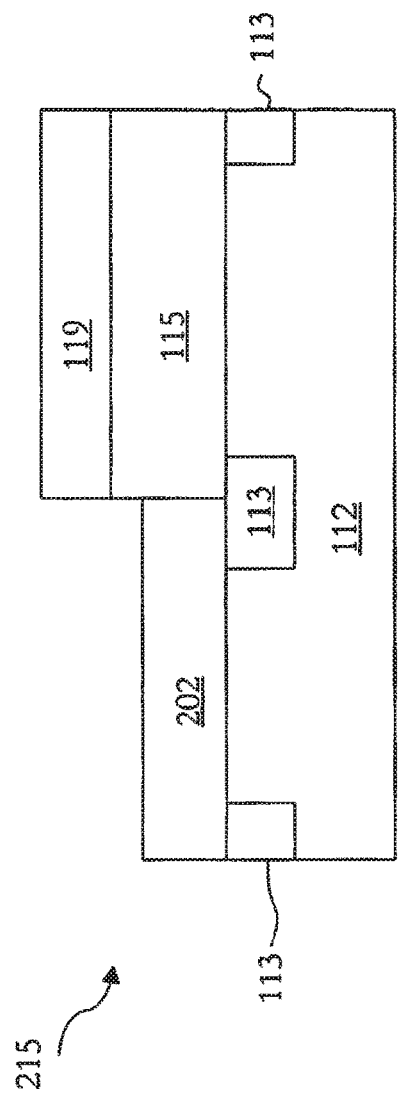

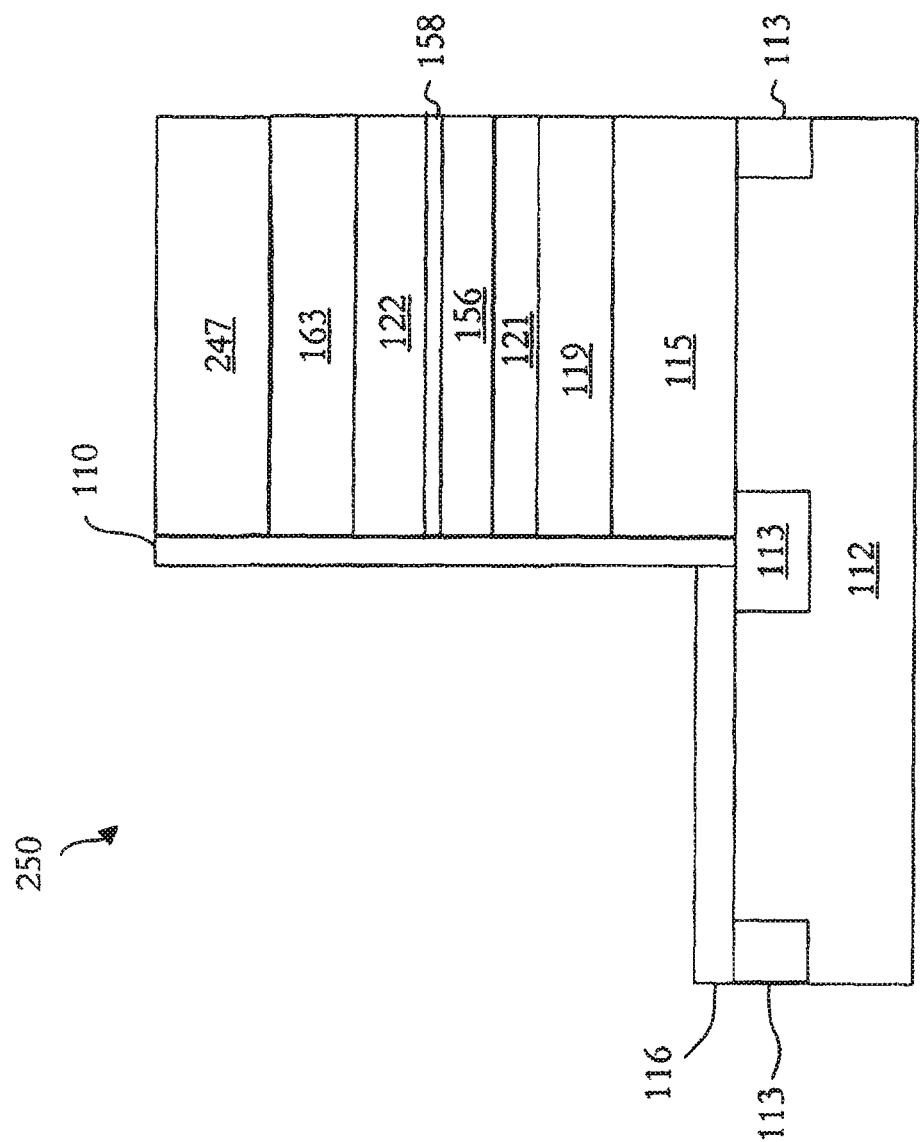

EXTREME HIGH MOBILITY CMOS LOGIC

This is a Continuation of application Ser. No. 14/977,479 filed Dec. 21, 2015 which is a Continuation of Ser. No. 14/302,371 filed Jun. 11, 2014 now U.S. Pat. No. 9,548,363 issued Jan. 17, 2017 which is Continuation of application Ser. No. 13/962,890 filed Aug. 8, 2013 now U.S. Pat. No. 8,802,517 issued Aug. 12, 2014 which is Continuation of application Ser. No. 13/450,359 filed Apr. 18, 2012 now U.S. Pat. No. 8,518,768, issued Aug. 27, 2013 which is a Divisional of application Ser. No. 11/305,452 filed Dec. 15, 2005 now U.S. Pat. No. 8,183,556, issued May 22, 2012.

TECHNICAL FIELD

This invention relates to semiconductor processing, and more particularly to the manufacture of extreme high mobility CMOS logic.

BACKGROUND

Complementary Metal Oxide Semiconductor (CMOS) transistor structures are essential in many modern electronic devices. CMOS chips include microprocessor, microcontroller, static RAM, and other digital logic circuits. A primary advantage of CMOS logic is that it only uses significant power when its transistors are switched between the on and off states. As a result, CMOS devices use little power and produce little heat.

CMOS structures are "complementary" in that a single CMOS device requires one PMOS transistor and one NMOS transistor, only one of which is switched on at a time. Traditionally, the PMOS transistor and the NMOS transistor in a CMOS device are both made of the same material, but are doped differently to provide the desired characteristics. High hole mobility is desirable for PMOS devices, and high electron mobility is desirable for NMOS devices. When the same material is used for both the NMOS and PMOS devices, often a tradeoff is made between high hole mobility and high electron mobility. For example, silicon, the most prevalently used semiconductor material, has a high electron mobility of 1400 $cm^2$/Vs, but only a moderate hole mobility of 450 $cm^2$/Vs.

BRIEF DESCRIPTION OF THE DRAWINGS

Features and advantages of the present invention will be apparent upon reading the following detailed description in conjunction with the accompanying drawings and appended claims provided below, where:

FIGS. 1B through 1B-6 illustrate cross sectional views of different embodiments of a CMOS device.

DETAILED DESCRIPTION

Described herein are methods of fabricating CMOS devices. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention. This invention is not restricted to the specific constructions and arrangements shown and described, because modifications may occur to those ordinarily skilled in the art. In other instances, well known semiconductor fabrication processes, techniques, materials, equipment, etc., have not been set forth in particular detail in order to not unnecessarily obscure embodiments of the present invention.

The following description details a CMOS device and a method of manufacturing a CMOS device with NMOS and PMOS transistors that may be formed of different material compositions and coexist on a monolithic substrate. By choosing materials with high hole mobility for the PMOS transistors, and materials with high electron mobility for the NMOS transistors, CMOS devices can be manufactured that can turn on at lower voltages, can generate less heat, can consume less power, and can have increased processing ability.

Figure 1A:
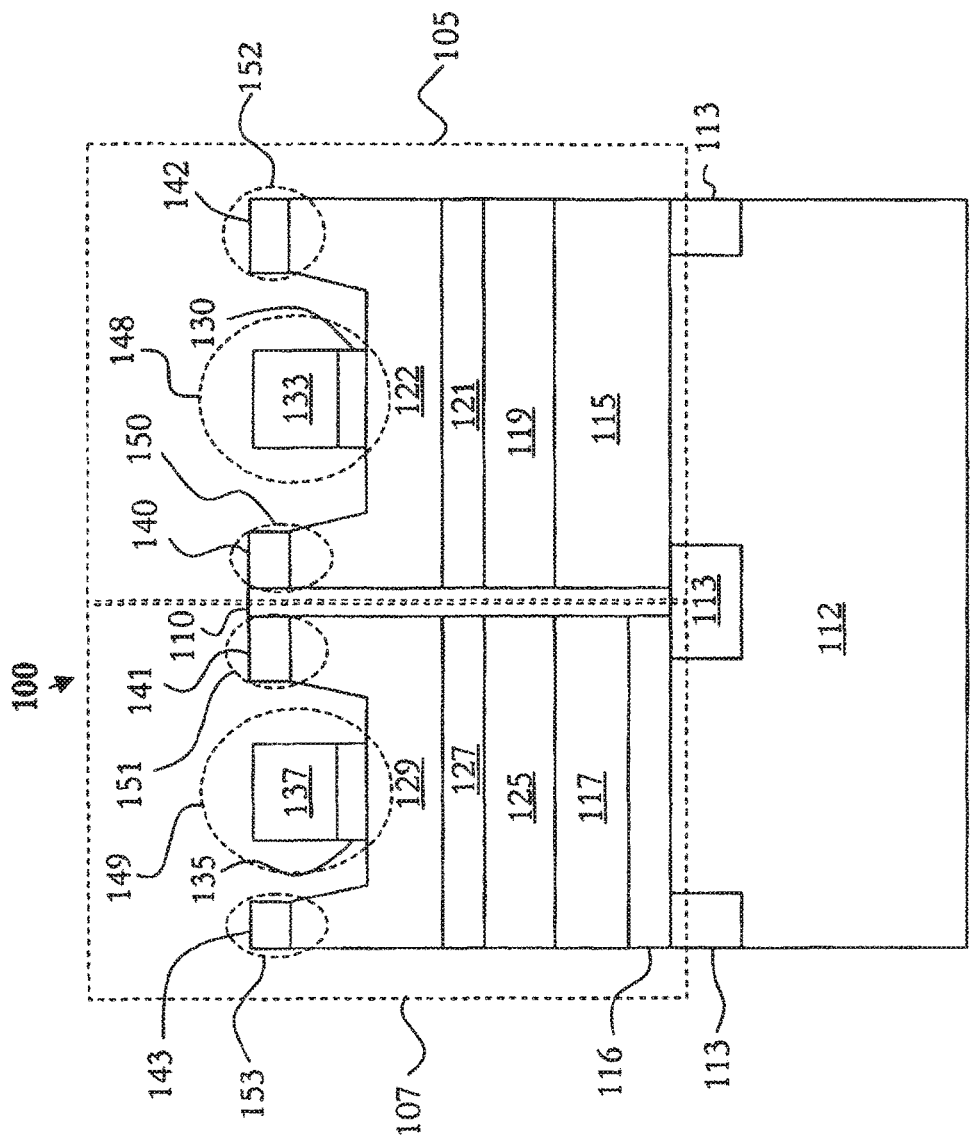
FIG. 1A illustrates an embodiment of a cross sectional view of a CMOS device.

FIG. 1A illustrates a cross section of a CMOS device 100 according to one embodiment of the present invention. As illustrated, the CMOS device 100 includes a PMOS transistor 105 and an NMOS transistor 107 formed on a substrate 112. In one embodiment, the substrate 112 is a highly resistive substrate. In one embodiment, the substrate 112 is a semi-insulating substrate. Semi-insulating substrates have a high-resistivity and can be valuable in reducing parasitic capacitances and cross-communication between transistors in high speed or high frequency applications.

Examples of semi-insulating substrates include silicon on insulator (SOI), silicon carbide (SiC), and doped silicon. Other examples of semi-insulating materials include III-V materials (materials in which one element is chosen from column III of the periodic table and one element is chosen from column V of the periodic table) such as gallium arsenide (GaAs) or indium phosphide (InP). In regards to doped silicon, heavy metal dopants can be added that bond with electron and/or hole traps to reduce free charge, and hence conductivity. Examples of possible dopants include chromium, gold, iron, and vanadium. In one embodiment, a p-type doped substrate is used. P-type dopants include, for example, Boron and Aluminum. Doped silicon substrates can come pre-doped, or a doping process can be implemented during device fabrication.

In one embodiment, the substrate 112 is a wafer. The wafer can be of a size sufficient for use in standard integrated circuit fabrication equipment. For example, in one embodiment the wafer is 300 mm in diameter.

In one embodiment, shallow trench isolation (STI) structures 113 are formed in the substrate 112. STI structures 113 can comprise oxides or other dielectric materials, and are used to define active areas and to separate device elements, such as transistors. In the illustrated embodiment of FIG. 1A, a shallow trench isolation structure 113 separates the PMOS transistor 105 from the NMOS transistor 107. In one embodiment, the shallow trench isolation structure 113 has a depth of about 80 nm to about 100 nm. In one embodiment, the shallow trench isolation structure 113 has a width of about 100 nm to about 200 nm. In alternative embodiments, no shallow trench isolation structures are formed. In one embodiment, deep trench isolation structures are formed.

A first buffer layer 115 separates the PMOS transistor 105 from the substrate 112. In certain embodiments, the first buffer layer 115 acts as a virtual substrate, permitting the PMOS transistor 105 to be built on an otherwise incompatible substrate 112. The first buffer layer 115 can be formed from silicon germanium (SiGe), indium aluminum antimonide (InAlSb), or other materials. In one embodiment, the first buffer layer 115 comprises materials with a larger lattice constant than the substrate 112. In one embodiment, the first buffer layer 115 is thick enough to trap defects (otherwise known as dislocations).

Defects often occur at locations of lattice mismatch and can cause current leakage when located near a channel. Therefore, by restricting lattice mismatches to the buffer layer, defects in the subsequent barrier layer can be prevented. Where a buffer layer is thick enough, defects can be distanced from the surface of the buffer layer, and are thus less likely to interact with subsequent layers. In one embodiment, the first buffer layer has a thickness of about 1-5 microns. In one embodiment, the first buffer layer is approximately 3 microns.

In certain embodiments, the first buffer layer 115 is a graded buffer layer (layer that includes two or more materials, the materials having a different ratio at top and the bottom ends). By grading the buffer layer, the amount of defects within the layer is reduced. Furthermore, lattice mismatches that are too large can generate defects that subsequently form threading dislocations. These threading dislocations can penetrate the entire layer and terminate at the surface, causing current leakage. Grading of the buffer layer can eliminate such threading dislocations.

In one embodiment, the first buffer layer 115 comprises a graded buffer layer that is step graded. A step graded layer includes a series of distinct steps, each step having a slightly different chemical composition. In one example, a step graded SiGe layer has three steps. A first step comprises 10% Ge and 90% Si, a second step comprises 20% Ge and 80% Si, and a third step comprises 30% Ge and 70% Si. To determine the number of steps necessary, one can set the beginning and ending compositions, and the degree of change in the composition between steps. The smaller the degree of change in chemical composition between steps, the greater the number of steps needed.

In one embodiment, the first buffer layer 115 comprises a graded buffer layer that is linearly graded. In a linearly graded layer, the chemical composition varies continuously, and every horizontal slice of the layer can yield a different composition. The degree of similarity between proximate slices depends upon the thickness of the layer and the degree of change in chemical composition between the top and bottom ends of the layer.

To minimize lattice mismatch, the first buffer layer 115 can be graded gradually (with a low rate of change). In one embodiment, the rate of change is between 5% and 30% per micrometer. For example, in one particular embodiment, when a SiGe buffer layer is used on a p-type doped silicon substrate, the SiGe buffer layer can have 100% Si and 0% Ge where it contacts the substrate. The SiGe buffer layer can be graded gradually, such that it has about 20% to 50% Si and 80% to 50% Ge where it contacts a first bottom barrier layer 119. In one embodiment, the first bottom barrier layer 119 is composed of a constant Ge concentration ranging from 70% to 30%. In one embodiment, the first buffer layer 115 comprises a SiGe buffer layer that is graded gradually from 100% Si to 30% Si. Use of a graded buffer layer can reduce defect densities from the order of $10^{12}/cm^2$ to the order of $10^5/cm^2$.

In certain embodiments, the first buffer layer 115 is a semi-insulating buffer layer or a highly resistive buffer layer. When the first buffer layer 115 is a semi-insulating buffer layer or a highly resistive buffer layer it can reduce parasitic capacitances and ameliorate or eliminate cross-communication between transistors. In one embodiment, the first buffer layer 115 is a semi-insulating buffer layer or a highly resistive buffer layer and the substrate 112 is comprised of high-resistivity silicon (Si).

Referring to FIG. 1A, a first bottom barrier layer 119 is situated over the first buffer layer 115. A first quantum well layer 121 is situated over the first bottom barrier layer 119, and a first top barrier layer 122 is situated over the first quantum well layer 121. The first bottom barrier layer 119, first quantum well layer 121, and first top barrier layer 122 form a PMOS quantum well structure that defines a first channel.

A quantum well (QW) structure is a specialized form of a heterojunction (an abrupt change in atom composition across a plane). The central feature in a heterojunction is a difference in the band gap of at least one of the valence or conduction bands. In the quantum well structure, the first bottom barrier layer 119 and first top barrier layer 122 can provide defect free QWs and localized carriers in the first quantum well layer 121 due to the band gap differences. The localized charge can only exist in the quantum well layer 121 at certain discreet quanta of energy, hence the name "quantum well."

In one embodiment, the first bottom barrier layer 119 has the same composition of Si and Ge that the graded buffer layer has where the two layers intersect. In an alternative embodiment, the first bottom barrier layer 119 has a greater concentration of Si than the graded buffer layer has where the two layers intersect. A larger concentration of Si in the first bottom barrier layer 119 causes it to have a larger lattice constant than the graded buffer layer, and the lattice mismatch can generate strain to the first bottom barrier layer 119. This strain can provide a large band offset between the first quantum well layer 121 and the first bottom barrier layer 119. In one embodiment, the first bottom barrier layer 119 comprises between about 40% Si to about 100% Si.

In one embodiment, the first bottom barrier layer 119 is lattice matched to the first buffer layer 115. This can facilitate the first barrier layer 119 remaining defect free. In example, if the first buffer layer 115 is a graded SiGe buffer layer, the first bottom barrier layer 119 can be SiGe and have the same ratio of silicon to germanium as the first buffer layer 115 where they intersect.

In certain embodiments, the first bottom barrier layer 119 should be thick enough to prevent it from becoming strained. Strain is prevented because; as a layer's thickness increases, the amount of strain in the layer decreases for a given lattice mismatch. Thus, beyond a certain critical thickness a layer will be relaxed. This critical thickness is the thickness at which the same amount of energy is required to maintain a strain as to revert back to an unstrained state. As the percentage of Ge increases starting from 0% Ge, the critical layer thickness decreases. The layer will remain relaxed above the critical layer thickness. With thick enough barrier layers, the first barrier layers can strain the first quantum well layer 121 without themselves becoming strained. The strain in the first quantum well layer 121 helps to increase the p-hole mobility. In one embodiment, the interfaces between the first QW layer 121 and the barrier layers 119 and 122 are free of defects (dislocations).

In exemplary embodiments, the first barrier layers 119 and 122 are also thick enough to prevent or ameliorate tunneling. Tunneling occurs when a particle passes through a barrier without the normally required energy, and can be a major source of current leakage in transistors. Tunneling can be prevented by increasing the amount of energy necessary to pass through the barrier, which is achieved by increasing barrier thickness. Thus at effective thickness levels, particles can be confined to the quantum well layer 121. In one embodiment, the first top barrier layer 122 and first bottom barrier layer 119 have thicknesses between approximately 100 and 500 angstroms. In one embodiment, the first top barrier layer 122 and first bottom barrier layer 119 have equal thicknesses. In another embodiment, the first top barrier layer 122 and first bottom barrier layer 119 have different thicknesses and $Si_xGe_{1-x}$ compositions. For example, the first top barrier layer 122 might have the composition $Si_{0.4}Ge_{0.6}$ and the first bottom barrier layer 119 might have the composition $Si_{0.3}Ge_{0.7}$. In one embodiment, the first top barrier layer 122 comprises 100% Si.

The barrier layers can strain the first quantum well layer 121, thereby improving its free charge carrier mobility. In one embodiment, the first top barrier layer 122 has substantially the same composition as the first bottom barrier layer 119. In an alternative embodiment, the first top barrier layer 122 and first bottom barrier layer 119 have different compositions. The first barrier layers, 119 and 122, place the first quantum well layer 121 under pressure from its top and bottom to maintain a particular lattice structure. Thus, the quantum well layer 121 can be more likely to maintain its strain.

The first quantum well layer 121 acts as the channel to the PMOS transistor 105, and can be formed of materials having a low bandgap and a high hole mobility. Examples of materials having these properties include germanium (Ge), gallium antimonide (GaSb), indium arsenide (InAs) and indium antimonide (InSb), which have hole mobilities of 1900, 1000, 500 and 850 $cm^2/Vs$, respectively. The surrounding barrier layers, in contrast, are formed from materials having a high band gap and a lattice structure similar to the lattice structure of the first quantum well 121, such as SiGe, AlSb and GaAlSb This difference in band gaps generates the quantum "well," in which charge of discrete energy levels can be produced in the QW layer. Charge carriers can be supplied to the QW layer by doping the barrier layer, for example by adding a delta doped layer. The doping of the barrier layer may be performed by in situ doping of the dopants or by ion implant of the dopants. In one embodiment, the first top barrier layer 122 is divided into a first spacer layer, a first delta doped layer, and a first barrier layer. The first delta doped layer can be a P-type delta doped layer and can comprise, for example, carbon, barilium, or other p-type dopants. A high hole mobility is desirable for PMOS transistors, for example, to increase operating speed and reduce power consumption.

In the illustrated embodiment of FIG. 1A, the first quantum well layer 121 is a buried channel. A buried channel has no direct interface to a gate oxide. Rather, an intermediary layer separates the channel from the gate oxide. As shown, the first top barrier layer 122 acts as the intermediary layer. Implementing a buried channel approach may increase mobility of electric charge, and reduces current leakage by reducing electron and hole scattering from surfaces and from impurities. In alternative embodiments, a surface channel approach may be implemented, in which the channel directly interfaces the gate oxide.

Straining the first quantum well layer 121 may improve hole mobility even further. In one embodiment, where a 100% Ge QW layer is used, the increase in mobility in the strained Ge QW is more than 4-6× compared with bulk (unstrained) Ge p-hole mobility. The larger the lattice mismatch between the QW layer and the barrier layers, the larger the strain and the higher the bandgap difference between them, This can increase mobility and decrease power consumption, among other advantages. A strained lattice formation is maintained by having the first quantum well layer 121 be sufficiently thin to match the lattice structure of the barrier layers. Strain is achieved because, it takes a first amount of energy for molecules of a layer to resist bonding with the molecules of adjacent layers, and a second amount of energy for the molecules of the layer to deviate from their natural lattice structure. Below a certain thickness, it requires less energy to change in lattice structure than to resist bonding.

To enable the quantum features of the first quantum well layer 121, the first quantum well layer 121 should be sufficiently thin to confine particles in one dimension, forcing those particles to occupy a planar region. To enable this feature, the quantum well thickness should be comparable to the de Broglie wavelength of the charge carriers (electrons and holes). In one embodiment, the first quantum well layer 121 has a thickness between about 50 and 300 angstroms.

In an exemplary embodiment, the first quantum well layer 121 has a lattice structure similar to, but not the same as, the lattice structure of the first barrier layers. Therefore, the first quantum well layer 121 and first barrier layers are slightly lattice mismatched. The greater the dissimilarity in lattice structures, the greater the strain on the first quantum well layer 121. However, if the lattice structure of the first quantum well layer 121 is too different from the lattice structure of the barrier layers, the energy required to maintain the strain is too high, and the quantum well layer will eventually revert to its unstrained lattice constant.

In one exemplary example, the barrier layers can be SiGe with between 5% and 30% Si, and the first quantum well layer can be Ge. A Ge layer sandwiched between two SiGe layers would be compressively strained, since Ge has a lattice constant that is 4.2% larger than Si. In one embodiment, there is a lattice mismatch of between 0.5% and 1.65% between the first barrier layers and the first quantum well layer 121.

In alternative embodiments, in which the quantum well layer 121 is not strained, it has a lattice structure that is the same as the lattice structure of one or both of the barrier layers. It can be advantageous to have matching lattice structures, whether through straining or because the natural lattice structures match, to ameliorate the possibility of defects between layers.

Referring back to FIG. 1A, a second buffer layer 117 separates the NMOS transistor 107 from the substrate 112. In one embodiment, the second buffer layer 117 comprises a polar material (materials having both covalent and ionic bonds). When the second buffer layer 117 comprises a polar material, a nucleation layer 116 can be formed between it and the substrate 112 to improve bonding. Since Si is a non-polar material (forms only covalent bonds), a nucleation layer 116 can reduce anti-phase domains (bonds of As—As or Ga—Ga that can increase device leakage). A reduction in anti-phase domains can eliminate carrier trapping and greatly increase bonding. In one embodiment, the nucleation layer 116 can comprise any III-V material (a material that comprises one element from column III of the periodic table and one element from column V of the periodic table) that has a larger lattice constant than Si, but a smaller lattice constant than the second buffer layer 117. For example, the nucleation layer 116 may comprise GaAs, AlSb, or other appropriate III-V materials. In further embodiments the nucleation layer is a semi-insulating layer or a highly resistive layer.

In one embodiment, the second buffer layer 117 is a graded buffer layer. In one particular embodiment, the second buffer layer 117 is a linearly graded InAlSb buffer layer that comprises 0% In where it intersects the nucleation layer 116. The percentage of In is gradually increased to approximately 85% In where the second buffer layer 117 contacts a second bottom barrier layer 125. In another embodiment, the second buffer layer 117 is a step-graded InAlSb buffer layer having an $In_xAl_{1-x}Sb$ composition wherein x varies for each step by a set amount.

The second buffer layer 117 can serve the same function for the NMOS transistor 107 that the first buffer layer 115 serves for the PMOS transistor 105. As with the first buffer layer 115, in various embodiments the second buffer layer 117 can act as a virtual substrate, can trap defects, and can be semi-insulating or highly resistive. In one embodiment, the second buffer layer 117 and nucleation layer have a combined thickness of about 1-5 microns.

Referring back to FIG. 1A, a second bottom barrier layer 125 is situated over the second buffer layer 117. A second quantum well layer 127 is situated over the second bottom barrier layer 125 and a second top barrier layer 129 is situated above the second quantum well layer 127. The second bottom barrier layer 125, second quantum well layer 127, and second top barrier layer 129 forms an NMOS quantum well structure that defines a second channel.

In various embodiments the NMOS quantum well structure has substantially the same structural properties as discussed with reference to the PMOS quantum well structure. For example, in one embodiment the second bottom barrier layer 125 is lattice matched to the second buffer layer 117, and the second top barrier layer 129 has substantially the same composition as the second bottom barrier layer 125. In another embodiment, the second barrier layers should be thick enough to prevent them from becoming strained and to prevent tunneling, and the second quantum well layer 127 should be thin enough to maintain strain and to confine particles to a single planar region. In other embodiments the second quantum well layer 127 can be a buried channel or a surface channel.

The second quantum well layer 127 acts as the channel to the NMOS transistor 107, and can be formed of materials having a low bandgap and high electron mobility. High electron mobility is desirable, for example, to increase operating speed and reduce power consumption. Examples of materials having these properties include indium antimonide (InSb) and indium arsenide (InAs), which have electron mobilities of 77,000 $cm^2/Vs$ and 40,000 $cm^2/Vs$, respectively. Other possible materials include combinations of at least two elements, at least one of the elements chosen from column III of the periodic table and at least one of the materials chosen from column V of the periodic table. For example, indium gallium antimonide (InGaSb) could be used to form the second quantum well layer 127. The surrounding barrier layers, in contrast, are formed from materials having a high band gap and a lattice structure similar to the lattice structure of the second quantum well 127, such as InAlSb, AlGaInSb, or AlSb. In one embodiment, in which the second QW layer 127 comprises InAs, the second barrier layers, 125 and 129, comprise InP or InAlAs.

As discussed with regard to the PMOS quantum well structure, in one embodiment the NMOS quantum well structure has a second quantum well layer 127 that is similar to, but not the same as, the lattice structure of the second barrier layers. In one embodiment, there is a lattice mismatch of between 0.5% and 2.0% between the second barrier layers 125 and 129 and the second quantum well layer 127. In alternative embodiments, the second quantum well layer 127 has the same lattice structure as the second barrier layers 125 and 129.

In one embodiment, the second buffer layer 117, second bottom barrier layer 125, and second top barrier layer 129 are relaxed InAlSb layers, and the second quantum well layer 127 is a compressively strained InSb layer. In an alternative embodiment, the second buffer layer 117, second bottom barrier layer 125, and second top barrier layer 129 are relaxed indium aluminum arsenide (InAlAs) layers, and the second quantum well layer 127 is an InAs layer. In further embodiments, the second quantum well layer 127 is an indium antimony arsenide (InSbAs) layer.

In the illustrated embodiment of FIG. 1A, a first high-k gate dielectric layer 130 is situated above the first top barrier layer 122. Use of high-k materials for gate dielectrics can provide substantial advantages, such as reducing gate leakage. Examples of materials that can be used to form the first high-k gate dielectric layer 130 include high-k dielectric materials such as aluminum dioxide ($Al_2O_3$), zirconium dioxide ($ZrO_2$), tantalum oxide ($Ta_2O_5$), aluminum nitride (AlN), silicon dioxide ($SiO_2$), gallium gadolinium oxide ($GaGdO_3$) and hafnium dioxide ($HfO_2$). Some materials such as $ZrO_2$ may have superior functionality in the PMOS transistor 105. In one embodiment, the first high-k gate dielectric layer 130 has a thickness of approximately 15-75 Angstroms.

A first metal gate electrode 133 is situated over the first high-k gate dielectric layer 130. Metal gate electrodes may be more effective than polysilicon electrodes when combined with high-k gate dielectric materials. Metal gate electrodes avoid Fermi level pinning at the metal electrode/high-k interface, which can cause high threshold voltages. Metal gate electrodes can also be effective in screening phonons from coupling to the channel under inversion conditions, resulting in improved channel mobility. In one embodiment, the first metal gate electrode 133 is a metal having a mid-gap work function of between around 4.4 to around 4.8 eV, such as titanium nitride (TiN). In alternative embodiments, the first metal gate electrode 133 is a p-type metal and has a work function of around 4.8 eV to around 5.6 eV. Examples of p-type metals include Ti, Ru, $Rb_2O$, Al, Ni, Co, Pt and Mo. Silicides and nitrides of these metals can also make effective metal gate electrodes. In one embodiment, the first metal gate electrode is about 500-1000 A thick. In one embodiment, gate length is about 20 nm-0.25 microns. In one embodiment, the source to gate and the gate to drain distances are about 50-100 A.

In the illustrated embodiment shown in FIG. 1A, the first high-k gate dielectric layer 130 and first metal gate electrode 133 form a first recessed gate structure 148. In a recessed gate, portions of the top barrier layer are etched to allow the gate to be closer to the channel (quantum well layer). This causes the source and drain regions of the transistor to be raised such that they partially enclose the gate. Recessed gates can provide better gate control, reduce the necessary operating voltage, and dramatically reduce any parasitic resistance of the transistor. Combining a recessed gate with a high-k gate dielectric can provide superior gate control, can allow for enhancement mode operation, and can reduce external resistance by providing a raised source drain geometry. In one embodiment, the first top barrier layer 122 is etched such that there is a distance of about 10-30 nm between the quantum well layer and the first high-k gate dielectric layer 130.

In alternative embodiments, the first high-k gate dielectric layer 130 and first metal gate electrode 133 form a non-recessed gate. This can reduce the number of processing steps and increase device simplicity.

Referring back to FIG. 1A, a second high-k gate dielectric layer 135 is situated above the second top barrier layer 129. In one embodiment, the second high-k gate dielectric layer 135 is formed of substantially the same materials as the first high-k dielectric layer 130. In alternative embodiments, the second high-k dielectric layer 135 is formed of different materials. For example, some materials such as $Al_2O_3$ may exhibit superior functionality in the NMOS transistor 107. In one embodiment, the second high-k gate dielectric layer 135 has a thickness of approximately 15-75 Angstroms. In one embodiment, the second high-k gate dielectric layer 135 comprises one of $HfO_2$, $ZrO_2$, $TiO_2$, $Al_2O_3$, $GaGdO_3$, AlN, BN, $SiO_2$, or another similar dielectric material.

A second metal gate electrode 137 is situated over the second high-k gate dielectric layer 135. In one embodiment, the second metal gate electrode 137 is a metal having a mid-gap work function of between around 4.4 to around 4.8 eV, such as TiN. In alternative embodiments, the second metal gate electrode 137 is an n-type metal and has a work function of around 3.9 eV to around 4.4 eV. N-type metals include, for example, Ti, Al and TiAl.

In the illustrated embodiment, the second high-k gate dielectric layer 135 and second metal gate electrode 137 form a second recessed gate structure 149. In one embodiment, the second recessed gate structure 149 has a depth of about 10-30 nm. In alternative embodiments, the second high-k gate dielectric layer 135 and second metal gate electrode 137 form a non-recessed gate.

As shown in FIG. 1A, isolation layer 110 separates the PMOS transistor 105 and the NMOS transistor 107. In the illustrated embodiment, the isolation layer extends to the substrate 112, and contacts the STI structure 113. The isolation layer 110 is comprised of materials having a high resistivity. In one embodiment, the isolation layer 110 comprises silicon dioxide ($SiO_2$) or silicon nitride ($Si_3N_4$). In one embodiment, the isolation layer 110 comprises the same material as the STI structures 113. In an alternative embodiment, the isolation layer 110 and STI structures 113 comprise different materials.

A PMOS drain metal contact 140 is situated above the drain region 150 of the PMOS transistor 105, and an NMOS drain metal contact 141 is situated above the drain region 151 of the NMOS transistor 107. A PMOS source metal contact 142 and NMOS source metal contact 143 are situated above the source region 152 of the PMOS transistor 105 and the source region 153 of the NMOS transistor 107, respectively. In one embodiment, all the metal contacts are comprised of the highly conductive metal. Highly conductive metals can facilitate device operation in a high frequency environment. In another embodiment, a Si contact metal such as Al is used for the PMOS contacts, and a III-V contact metal such as Ti or Pt is used for the NMOS contacts.

In one embodiment, a substrate 112, buffer layers 115 and 117, nucleation layer 116, recessed gate structures 148 and 149, buried channels, high-k gate dielectrics, metal gate electrodes 133 and 137 and quantum well structures are combined for both the PMOS transistor 105 and NMOS transistor 107 to form a CMOS device that can have a maximized free charge mobility and minimal leakage. In another embodiment, these features are combined to form an AlSb, GaAs or III-V binary material nucleation layer, an $In_xAl_{1-x}Sb$ buffer layer, $In_xAl_{1-x}Sb$ barrier layers with the same or different In compositions, an InSb quantum well layer for the NMOS transistor. For the PMOS transistor, the features are combined to form a graded SiGe buffer layer, relaxed SiGe barrier layers and a strained Ge quantum well layer for the PMOS transistor. The PMOS transistor 105 and NMOS transistor 107 of this embodiment may have further improvement in free charge mobility.

FIG. 1B illustrates a cross section 154 of the CMOS device of FIG. 1A. In accordance with multiple embodiments of the present invention, FIGS. 1B-1 through 1B-3 illustrate variant compositions of the first top barrier layer 122 and FIGS. 1B-4 through 1B-6 illustrate variant compositions of the second top barrier layer 129.

In the illustrated embodiment of FIG. 1B-1, the first top barrier layer 122 comprises a first spacer layer 156, a first delta doped layer 158, a first barrier layer 123, a first etch stop layer 161, and a first cap layer 163. The first spacer layer 156 is placed to separate the first delta doped layer 158 from the first quantum well layer 121. In one embodiment, the first spacer layer 156 has substantially the same composition as the first bottom barrier layer 119. In one embodiment the first spacer layer 156 has a thickness of about 20-100 angstroms.

The first delta doped layer 158 is a thin doped layer that resides between thicker un-doped layers. The first delta doped layer 158 provides an abundance of free charge carriers to the first quantum well layer 121. Since the first delta doped layer 158 is formed in the PMOS transistor 105, the first delta doped layer 158 is doped with a P-type dopant such as boron, indium and zinc, and provides an abundance of holes to the channel. In one embodiment the first delta doped layer 158 has a dopant concentration sufficient to provide $5\times10^{11}/cm^2$ to $2\times10^{12}/cm^2$ sheet carrier concentrations to the first quantum well layer 121. In one embodiment, the first delta doped layer 158 has a thickness of about three angstroms to about five angstroms.

In alternative embodiments, the first delta doped layer 158 can be formed in the first bottom barrier layer 119. A delta doped layer formed in the bottom barrier layer functions substantially the same as one formed in the top barrier layer. In both instances, the delta doped layer provides free charge carriers to the quantum well layer. In embodiments where no delta doped layer is formed in either the top or the bottom barrier layers, the quantum well layer itself can be doped to generate free charge carriers.

Referring back to FIG. 1B-1, the first barrier layer 123 has substantially the same composition as the first bottom barrier layer 119. In one embodiment, the first barrier layer 123 has a thickness of about 100-500 angstroms. The etch stop layer 161 is provided to prevent over-etching in future processing stages. The etch stop layer 161 possesses drastically different etching characteristics than those of materials that will later be deposited and etched. This provides a high degree of protection from over-etching. In one embodiment, the etch stop layer 161 comprises AlSb. In one embodiment, the etch stop layer is approximately 10-50 A.

The first cap layer 163 reduces contact resistance, which can improve device performance. In one embodiment, the first cap layer 163 comprises a material that has a smaller bandgap than the first barrier layer 123, which causes strain in the first barrier layer 123, further reducing contact resistance. In one embodiment, the first cap layer 163 comprises p-type doped epitaxial silicon. In one embodiment, the first cap layer 163 has a thickness of around 10-50 nm. In the illustrated embodiment of FIG. 1B-1, the recessed gate structure is formed in the first cap layer 163.

In the illustrated embodiment of FIG. 1B-2, the first top barrier layer 122 comprises a first spacer layer 156, a first delta doped layer 158, and a first barrier layer 123. In this embodiment, the recessed gate structure is formed in the first barrier layer 123 and comprises a shallow recessed gate, in which there is a comparatively large distance between the first quantum well layer 121 and the first high-k gate dielectric layer 130.

In the illustrated embodiment of FIG. 1B-3, the first top barrier layer 122 comprises a first spacer layer 156, a first delta doped layer 158, and a first barrier layer 123. In this embodiment, the recessed gate structure is formed in the first barrier layer 123 and comprises a deep recessed gate, in which there is a comparatively small distance between the first quantum well layer 121 and the first high-k gate dielectric layer 130.I In the illustrated embodiment of FIG. 1B-4, the second top barrier layer 129 comprises a second spacer layer 165, a second delta doped layer 168, a second barrier layer 128, a second etch stop layer 170, and a second cap layer 172. In one embodiment, the second spacer layer 165 has a composition that is substantially similar to the composition of the second bottom barrier layer 125. In one embodiment, the second spacer layer 165 has a thickness of approximately 20-100 angstroms.

Since the second delta doped layer 168 is formed in the NMOS transistor 107, it is an N-type delta doped layer and comprises an N-type dopant such as silicon, tellurium, phosphorus, arsenic, or antimony. The second delta doped layer 168 provides an abundance of electrons to the channel, improving device performance. In one embodiment, the second delta doped layer has a thickness of approximately 3-5 angstroms and provides about $5 \times 10^{11}/cm^2$ to about $2 \times 10^{12}/cm^2$ sheet carrier donors to the second quantum well layer 127.

In one embodiment, the second etch stop layer comprises AlSb, InP or other III-V materials, which can be selectively etched with respect to the second barrier layer 128. In one embodiment, the second etch stop layer 170 has a thickness of about 10-50 Å.

The second cap layer 172 improves contact resistance for the NMOS transistor 107. In one embodiment, the second cap layer 172 comprises InGaAs with a high concentration of In. In alternative embodiments, the second cap layer 172 comprises one or more highly doped low bandgap material. In one embodiment, the second cap layer 172 comprises n-doped InSb. In one embodiment, the second cap layer 172 has a thickness of about 10-50 nm.

In the illustrated embodiment of FIG. 1B-5, the second top barrier layer 129 comprises a second spacer layer 165, a second delta doped layer 168, and a second barrier layer 128. In this embodiment, the recessed gate structure is formed in the second barrier layer 128 and comprises a shallow recessed gate.

In the illustrated embodiment of FIG. 1B-6, the second top barrier layer 129 comprises a second spacer layer 165, a second delta doped layer 168, and a second barrier layer 128. In this embodiment, the recessed gate structure is formed in the second barrier layer 128 and comprises a deep recessed gate.

FIGS. 2A through 2M illustrate cross sections of the CMOS device 100 in various stages of manufacture according to one possible process flow. In alternative embodiments other process flows may be used. In the illustrated process flow, not every step of manufacture is shown, so as not to obfuscate the invention. For example, wherever a layer is selectively formed or deposited on the substrate, or selectively etched from the substrate, a photolithography process can be performed to enable such selectivity. In a photolithography process, photoresist is applied to the substrate and patterned such that portions of the substrate are exposed and other portions are covered. Patterning photoresist commonly includes exposing portions of the photoresist to high intensity radiation in a photolithography device, and etching the exposed portions. In subsequent processes, areas covered by the photoresist are protected, such as from etching.

FIG. 2A illustrates a cross sectional view 200 of a substrate 112 in which STI structures 113 have been formed. STI structures can be formed by selectively etching portions of the substrate 112, and filling the etched regions with a dielectric material such as silicon dioxide. To selectively etch portions of the substrate 112, either a standard photomask or a hard mask such as silicon nitride can be used to protect regions that will not be etched. In one embodiment, a pad oxide is formed before the hard mask to relieve stress between the underlying substrate 112 and the hard mask.

FIG. 2B illustrates a cross sectional view 205 of the substrate of FIG. 2A after formation of a photoresist 202. The photoresist 202 in the illustrated embodiment has been selectively etched to protect regions of the substrate 112 where NMOS transistors will later be formed. In an alternative embodiment, a hard mask may be formed rather than a standard photoresist mask. In one embodiment, a pad oxide is formed prior to formation of the hard mask to relieve stress between the substrate 112 and the hard mask.

FIG. 2C illustrates a cross sectional view 210 of a CMOS device 100 in an intermediate stage of manufacture after application of a first buffer layer 115 on the substrate 112. The first buffer layer 115 can be deposited, for example, by chemical vapor deposition (CVD) or molecular beam epitaxy (MBE). In the illustrated embodiment, the substrate 112 is a p-type doped Silicon wafer or highly resistive Si wafer and the first buffer layer 115 is a graded SiGe buffer layer.

Figure 2E:
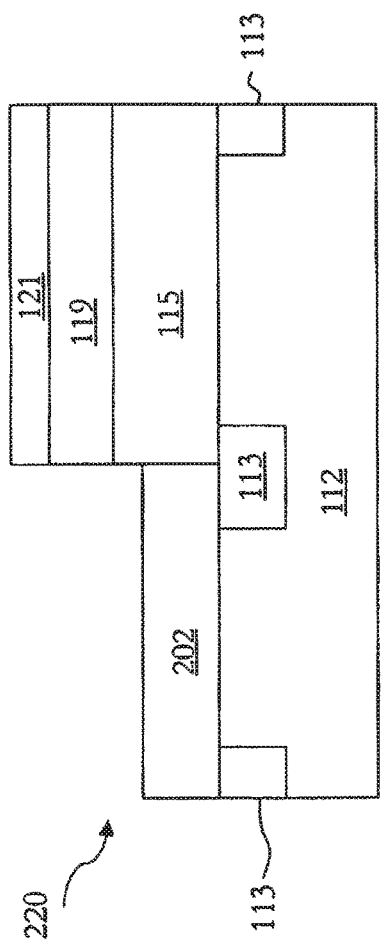
FIGS. 2A through 2Z illustrate cross sectional views of a CMOS device in intermediate stages of manufacture in accordance with one embodiment of the invention.

FIG. 2D illustrates a cross section 215 of the CMOS device 100 after the first bottom barrier layer 119 has been formed over the first buffer layer 115. FIG. 2E shows a cross section 220 of the CMOS device 100 after the first quantum well layer 121 has been formed over the first bottom barrier layer 119. The first bottom barrier layer 119 and first quantum well layer 121 can be deposited, for example, by CVD or MBE. In the illustrated embodiment, the first bottom barrier layer 119 is relaxed SiGe and the first quantum well layer 121 is strained Ge.

Figure 2F:
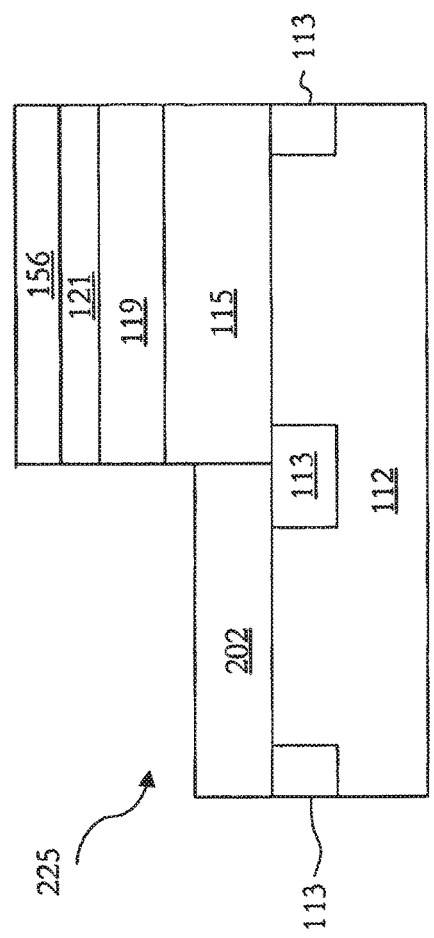
Figure 2G:
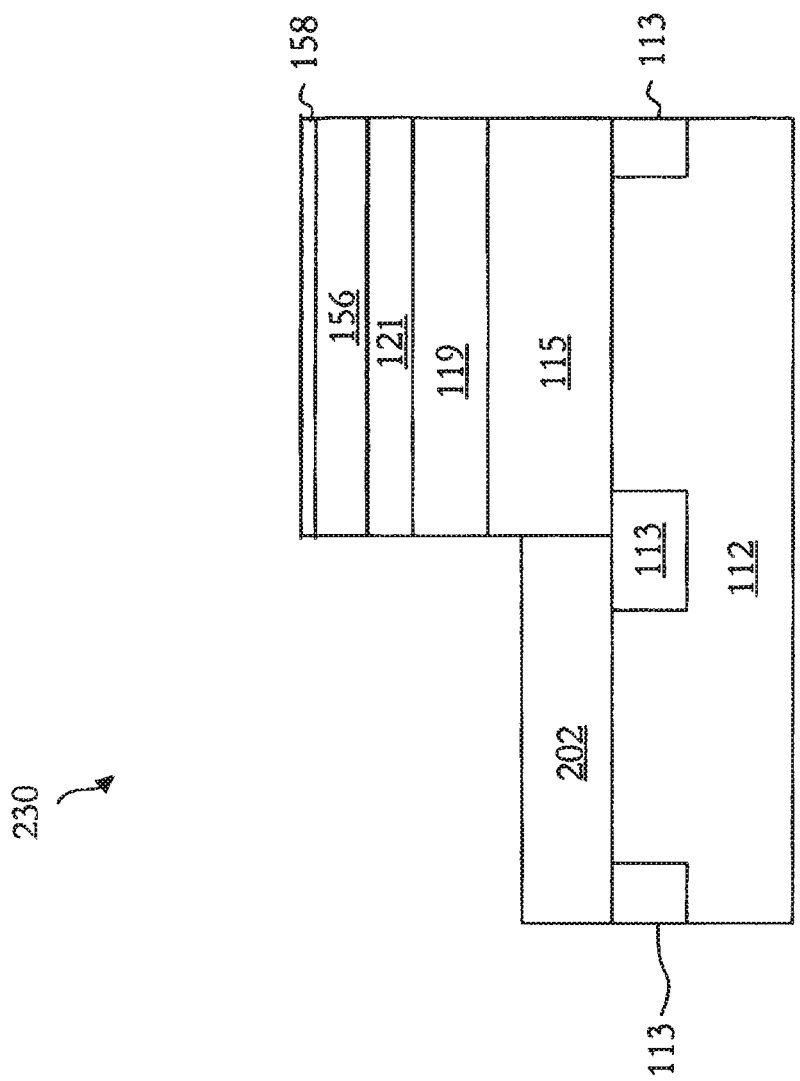
Figure 2H:
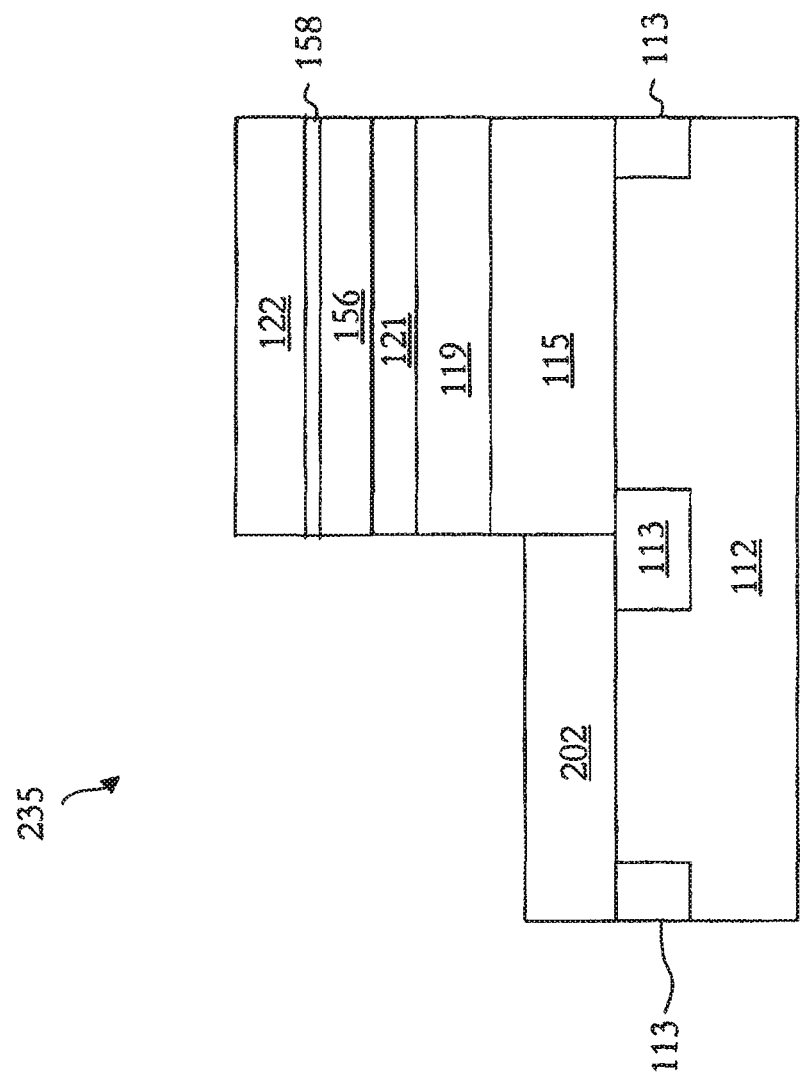

FIG. 2F shows a cross section 225 of the CMOS device 100 after a first spacer layer 156 has been formed over the first quantum well layer 121. FIG. 2G shows a cross sectional view 130 of the CMOS device 100 after a first delta doped layer 158 has been formed over the first spacer layer 156. FIG. 2H illustrates a cross section 235 of the CMOS device 100 after formation of a first top barrier layer 122.

In one embodiment, the first delta doped layer 158 can be formed in the same processing stage as the first spacer layer 156 by introducing a dopant into the processing chamber after the first spacer layer 156 has achieved an appropriate thickness. After the first delta doped layer 158 has achieved the desired thickness, no more dopant is introduced into the processing chamber and/or the dopant is evacuated from the chamber. In one embodiment, the dopant is introduced for about 15-45 seconds. Thereafter, formation of the first top barrier layer 122 can also commence in the same processing stage. In the illustrated embodiment, the first top barrier layer 122 is relaxed SiGe. In alternative embodiments, the first delta doped layer 158 can be formed during the deposition of the first bottom barrier layer 119 in substantially the same manner as set forth above.

In one embodiment, the first buffer layer 115, first bottom barrier layer 119, first quantum well layer 121, first spacer layer 156, first top barrier layer 122, and first delta doped layer 158 are all formed in a single process. For example, in one embodiment a graded SiGe layer is first deposited by CVD or MBE. During deposition, initially only Si is introduced into a CVD or MBE processing chamber. After a certain thickness of Si has been deposited, slowly the percentage of Ge in the processing chamber is increased from 0% to between 55% and 75%. The percentage of Si remains fixed until a first bottom barrier layer 119 of between 100-500 angstroms (A) has been deposited. No more Si is introduced into the processing chamber and/or the Si is evacuated from the chamber, and Ge is deposited to a thickness of between 50-300 A to form the first quantum well layer 121. Si is again added to the chamber to the same previously fixed percentage to begin forming the first spacer layer 156. After approximately 20-100 A have been deposited, a dopant is introduced to the chamber to form a first delta doped layer 158 of 3-5 A. No more dopant is introduced into the processing chamber and/or the dopant is evacuated from the chamber, and the first top barrier layer 122 is deposited to a thickness between 100-500 A.

In one embodiment, after the deposition of the first buffer layer 115, the amount of Si in the processing chamber is increased such that the first bottom barrier layer 119 has a higher concentration of Si than the first buffer layer 115 has where they come in contact. The first spacer layer 156 and first top barrier layer 122 would then be formed with the same composition as the first bottom barrier layer 119. In alternative embodiments, one or more of the layers are deposited in separate processing steps.

Figure 2I:
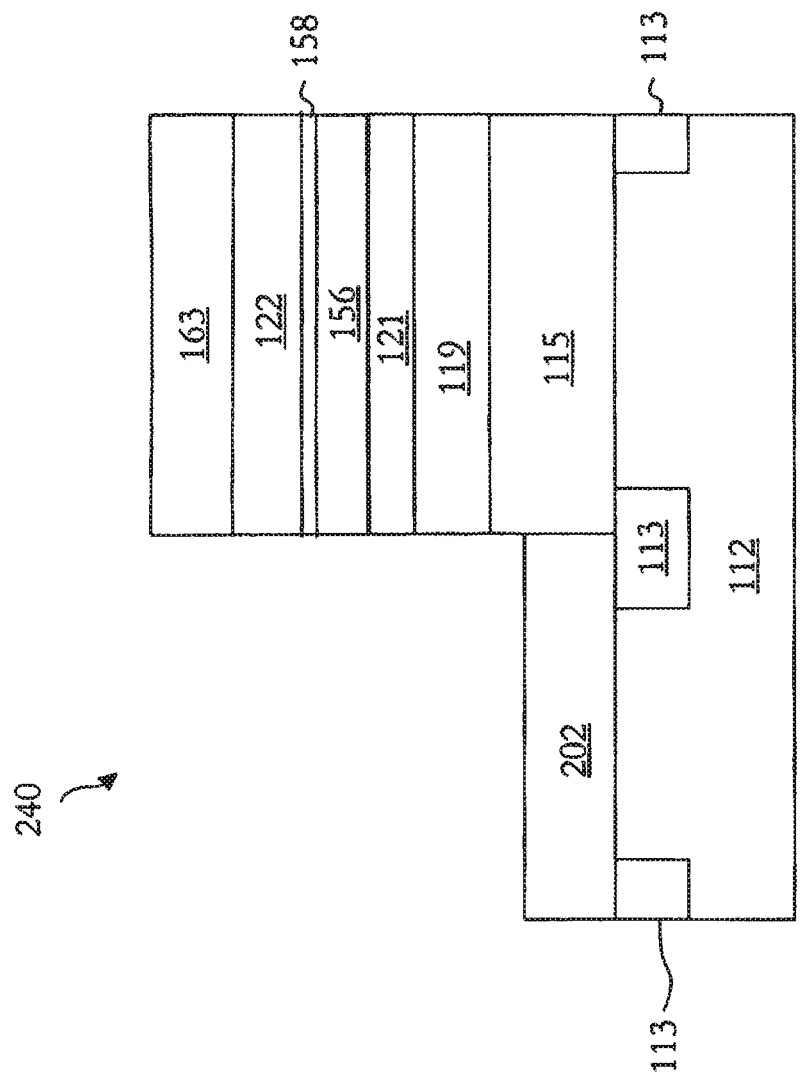

Referring to FIG. 2I, a cross section 240 of the CMOS device 100 is illustrated after the formation of a first cap layer 163. In one embodiment, the first cap layer 163 comprises silicon that is grown or deposited over the first top barrier layer 122 epitaxially.

Figure 2J:
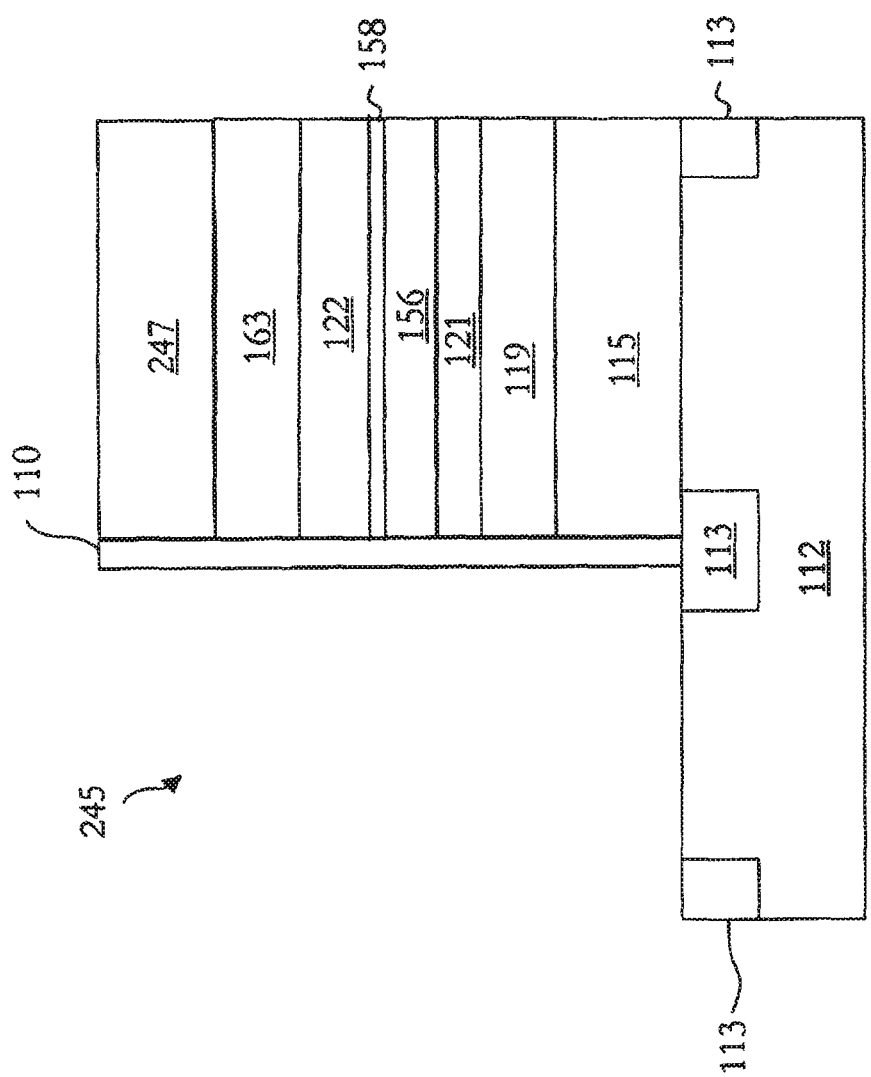

FIG. 2J illustrates a cross section 245 of the CMOS device 100 of FIG. 2I after additional processing steps. As illustrated, the photoresist 202 was removed, and subsequently a new photoresist 247 was placed and etched such that it protects PMOS transistor regions. In one embodiment, a hard mask is used rather than a standard photomask. After placement of the new photoresist 247, an isolation layer 110 was deposited on the side wall of the PMOS transistor 105. The isolation layer 110 can be formed, for example, by CVD or MBE, and comprises a dielectric material such as silicon dioxide. In an alternative embodiment, the isolation layer 110 can be formed by anisotropically etching the region between the PMOS transistor 105 and NMOS transistor 107 and filling the etched region with a dielectric material after both transistors have been formed. In one embodiment, the isolation layer 110 has a thickness between about 10-200 A.

Figure 2L:
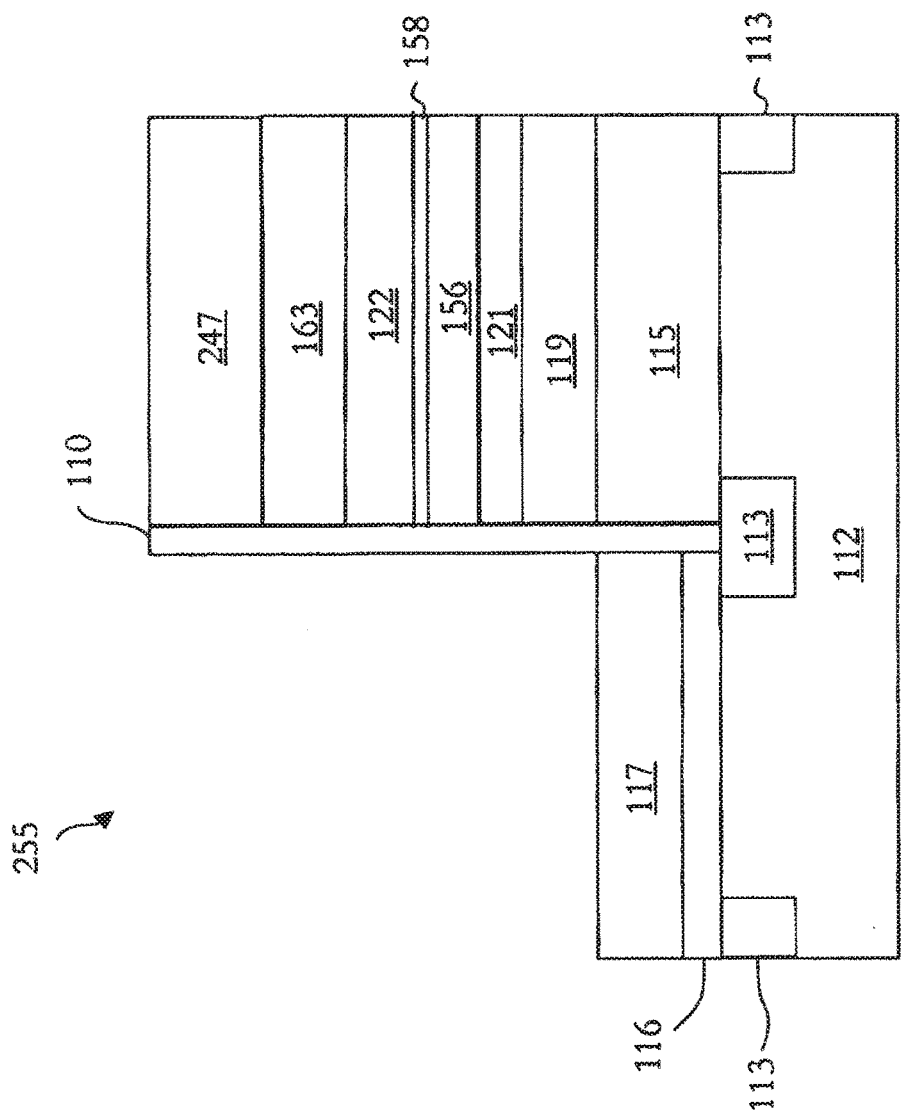

FIG. 2K shows a cross section 250 after a nucleation layer 116 has been formed on the substrate 112. In one embodiment, the nucleation layer is formed by MBE or CVD at a temperature no higher than about 650 degrees C. FIG. 2L shows a cross section 255 after a second buffer layer 117 has been formed on the nucleation layer 116. The second buffer layer 117 can be deposited, for example, by CVD, MBE or MOCVD. In the illustrated embodiment, the nucleation layer 116 is an AlSb layer and the second buffer layer 115 is a metamorphic InAlSb buffer layer.

Figure 2M:
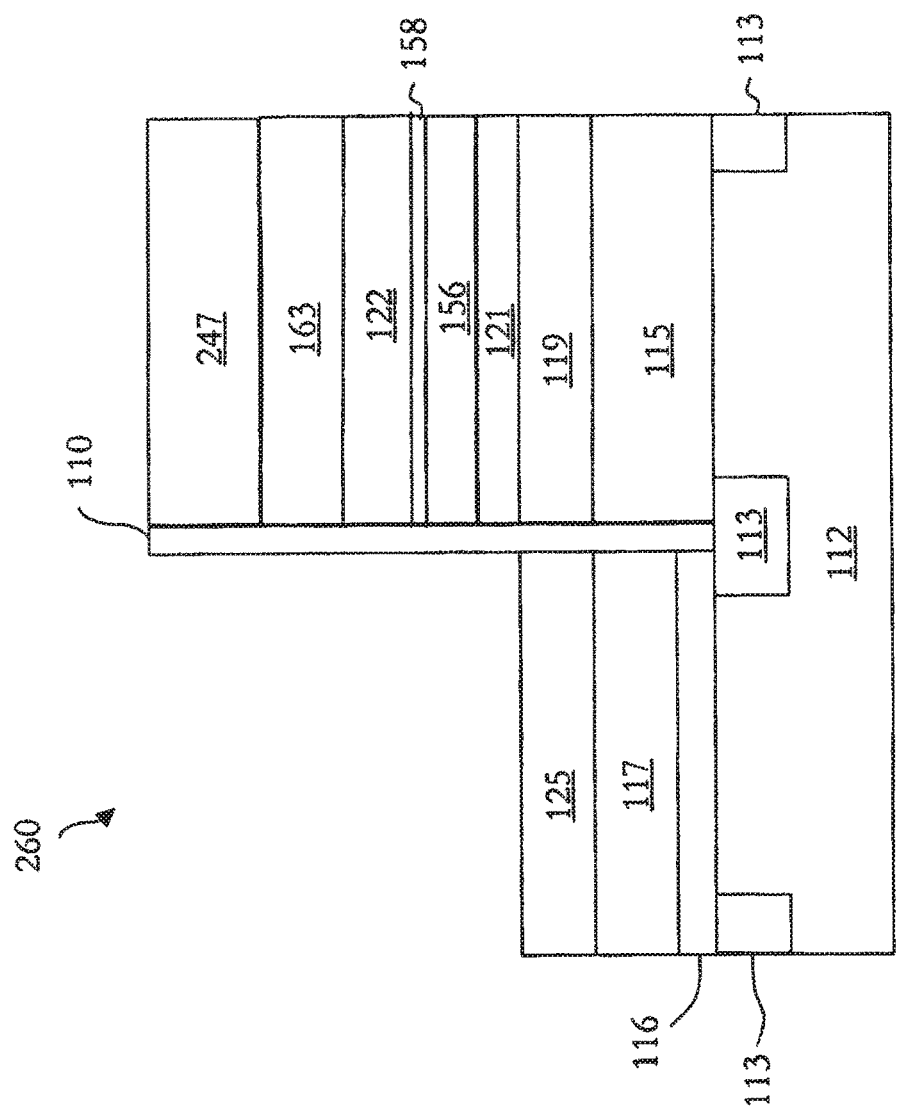
Figure 2N:
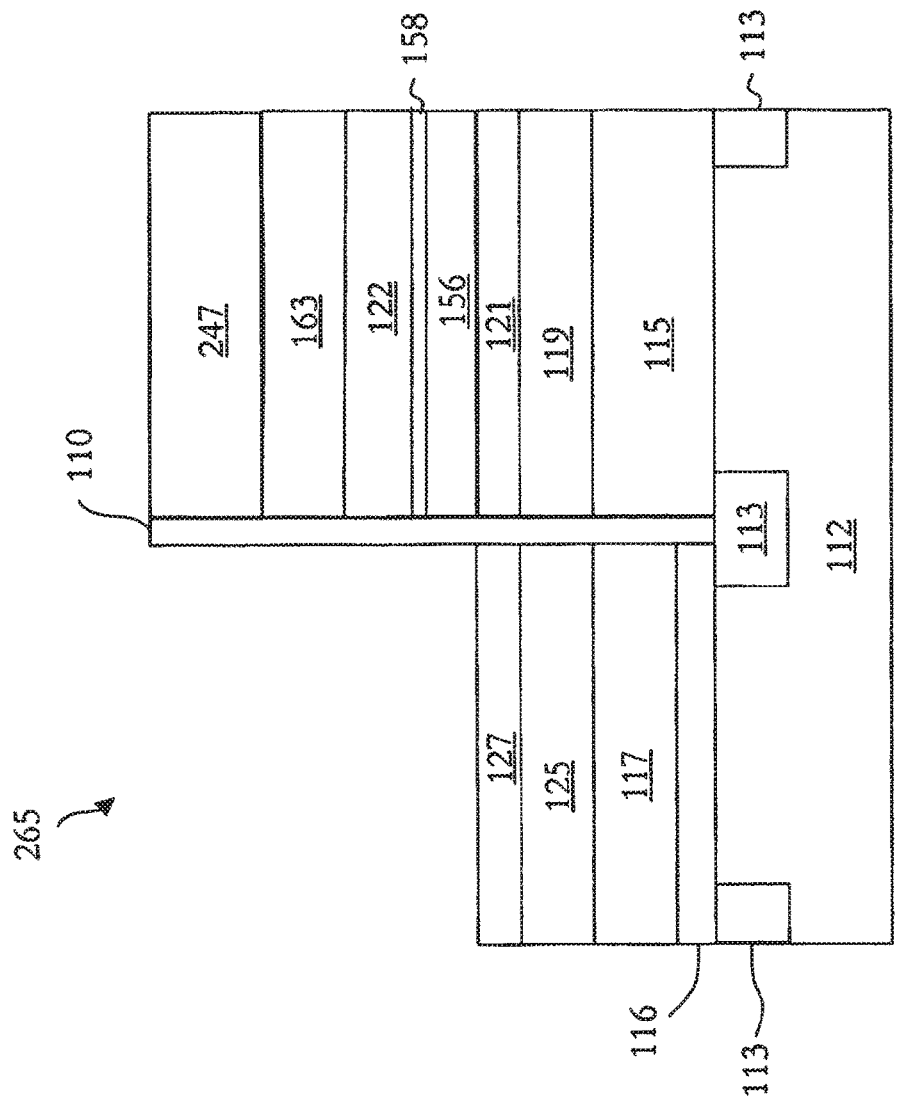

FIG. 2M shows a cross section 160 of the CMOS device 100 after the second bottom barrier layer 125 has been formed over the second buffer layer 117. FIG. 2N shows a cross section 265 of the CMOS device 100 after the second quantum well layer 127 has been formed over the second bottom barrier layer 125. The second bottom barrier layer 125 and second quantum well layer 127 can be deposited, for example, by CVD or MBE. In the illustrated embodiment, the second bottom barrier layer 125 is relaxed InAlSb and the second quantum well layer 127 is strained InSb.

Figure 2O:
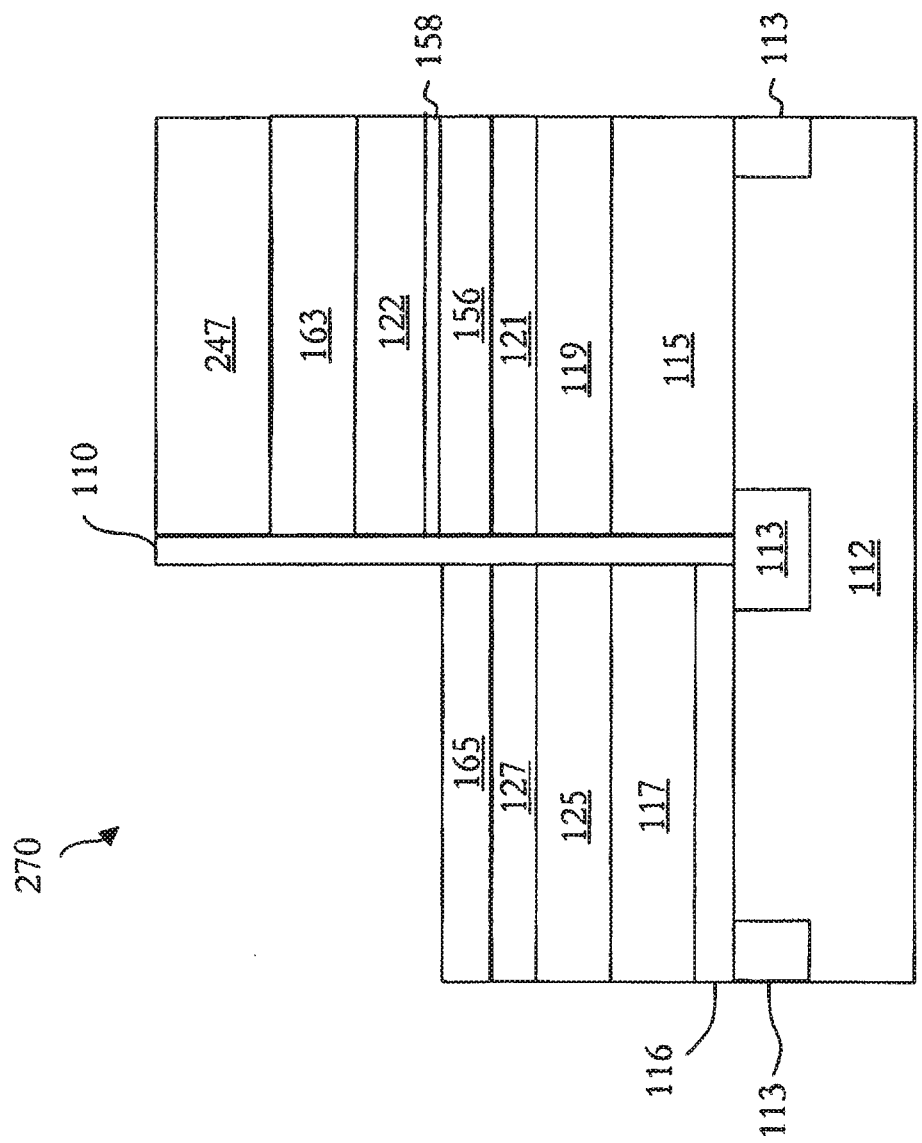
Figure 2P:
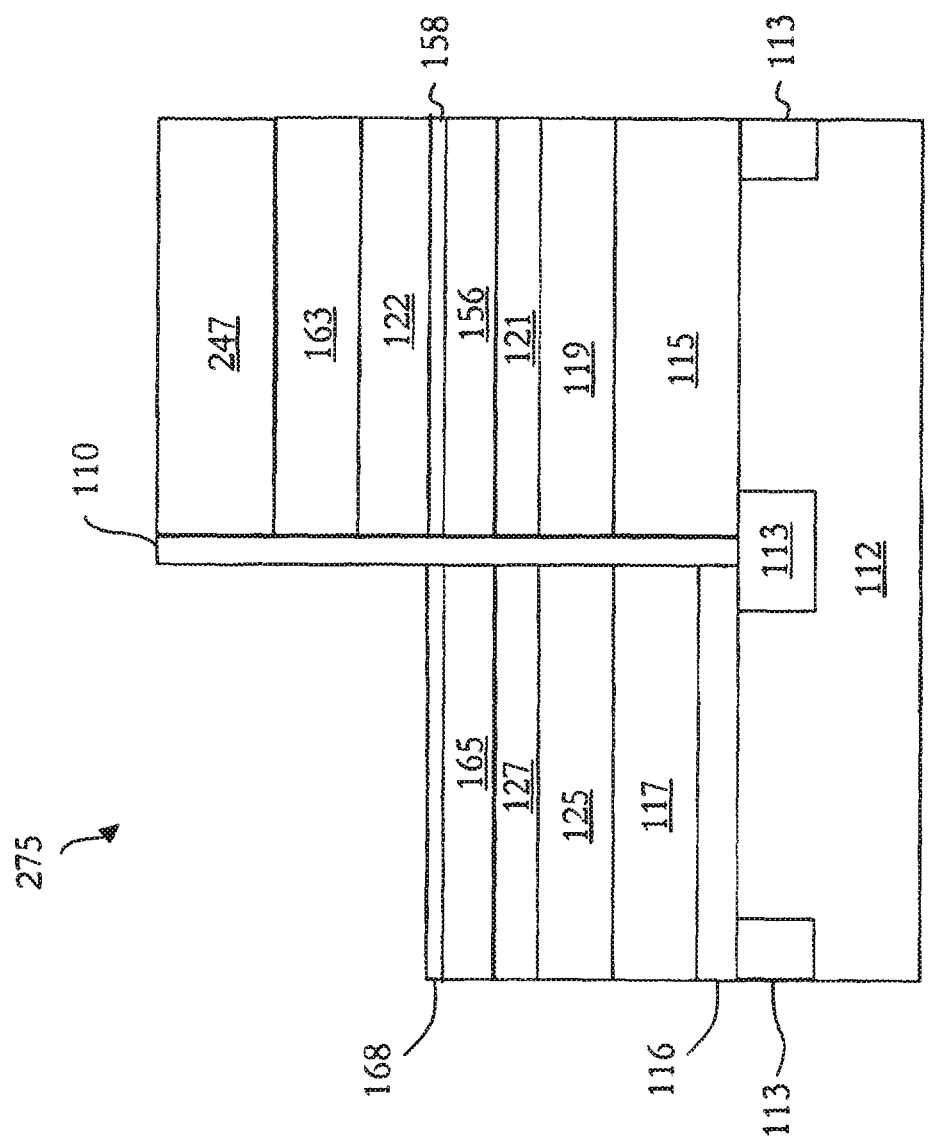
Figure 2Q:
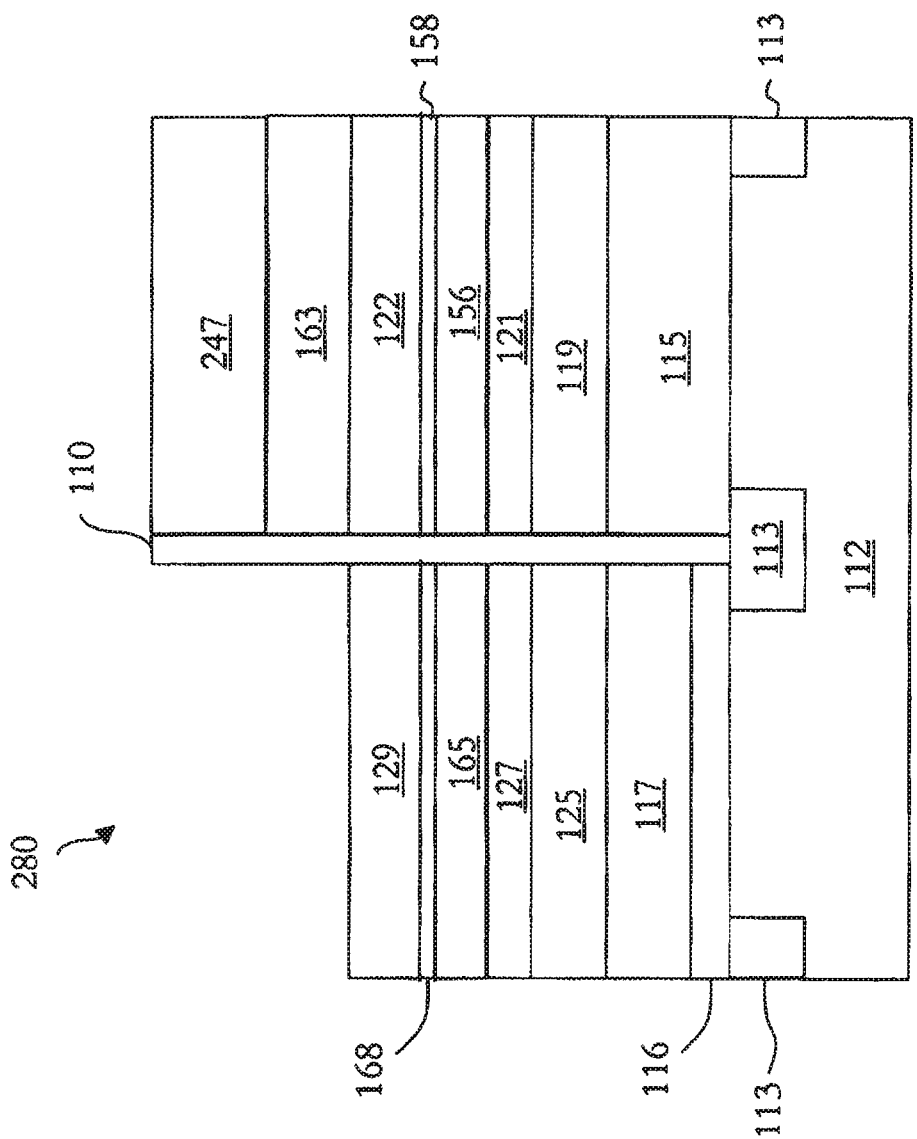

FIG. 2O shows a cross section 270 of the CMOS device 100 after a second spacer layer 165 has been formed over the second quantum well layer 127. FIG. 2P shows a cross section 275 of the CMOS device 100 after a second delta doped layer 168 was formed over the second spacer layer 165. The second delta doped layer 168 can be formed in substantially the same manner as the first delta doped layer 158. FIG. 2Q shows a cross section 280 of the CMOS device 100 after a second top barrier layer 129 has been formed. In the illustrated embodiment, the second spacer layer 165 and second top barrier layer 129 are relaxed InAlSb.

In additional exemplary embodiments, the second delta doped layer 168 can be formed during the deposition of the second top barrier layer 129 in substantially the same manner as set forth above.

In one embodiment, the nucleation layer 116, second buffer layer 117, second bottom barrier layer 125, second quantum well layer 127, second spacer layer 165, second top barrier layer 129, and second delta doped layer 168 are all formed in a single process. For example, in one embodiment a nucleation layer 116 of AlSb is first deposited by CVD, MBE or MOCVD. Subsequently, In is gradually added to the processing chamber to form a graded InAlSb layer until the buffer layer and nucleation layer have a combined thickness between one and five microns, and the second buffer layer 117 has approximately 15-30% Al. The amount of In in the chamber remains constant until an InAlSb barrier layer 125 is formed with a thickness of between 100-500 angstroms.

No more Al is added to the processing chamber and/or the Al is removed from the chamber and InSb is deposited to a thickness of between 50-300 A to form the second quantum well layer 127. Al is again added to the chamber to begin forming the second spacer layer 165 at the same set composition as the second bottom barrier layer 125. After approximately 20-100 A have been deposited, a dopant is introduced to the chamber to form a second delta doped layer 168 having a thickness of 3-5 Å. The dopant is evacuated from the chamber, and the second top barrier layer 129 is deposited to a thickness between 100-500 A. In alternative embodiments, one or more of the layers are deposited in separate processing steps.

Figure 2R:
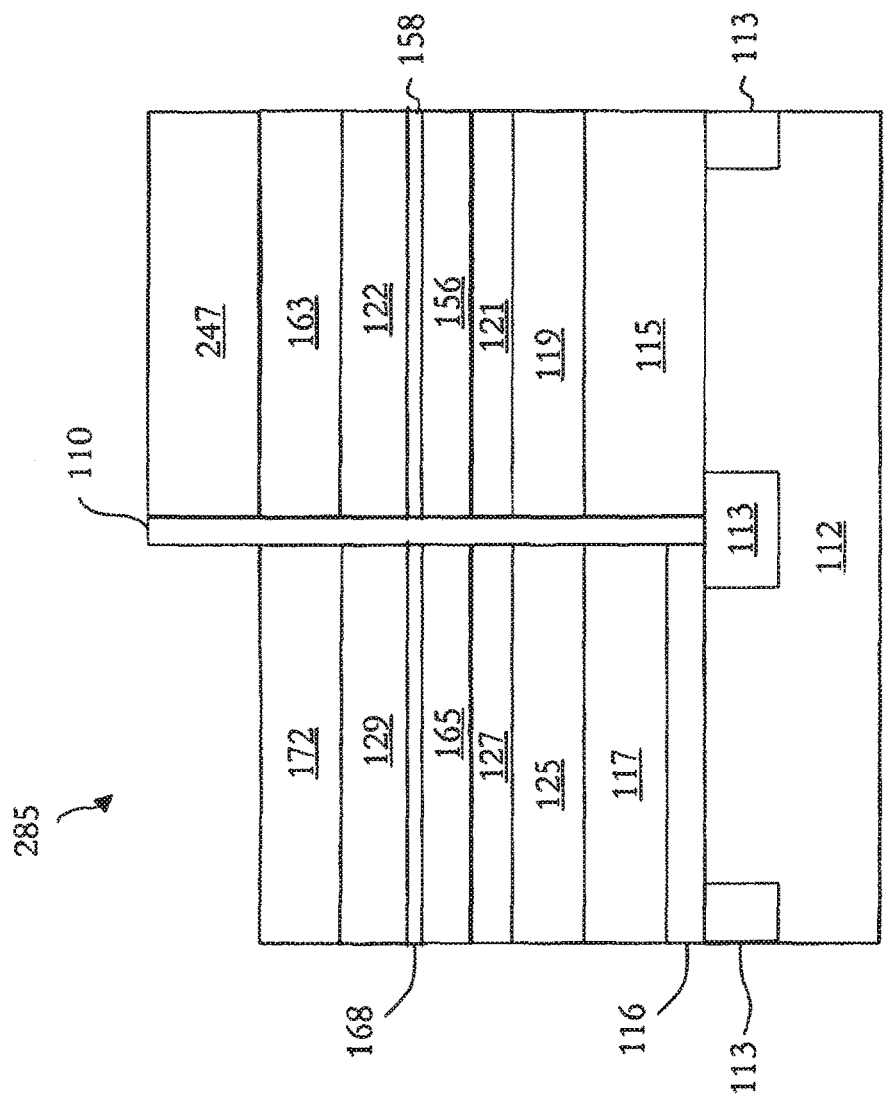

FIG. 2R shows a cross section 285 of the CMOS device 100 after a second cap layer 172 has been formed over the second top barrier layer 129. In one embodiment, the second cap layer 172 is formed by CVD, MBE or MOCVD and comprises n-doped InSb.

In one embodiment, the second buffer layer 117, second bottom barrier layer 125, second quantum well layer 127, second spacer layer 165, second delta doped layer 168, second top barrier layer 129 and second cap layer 172 are all formed at processing temperatures below at least 500 degrees C. In one embodiment, these processes are performed at or below around 420 degrees C.

Figure 2S:
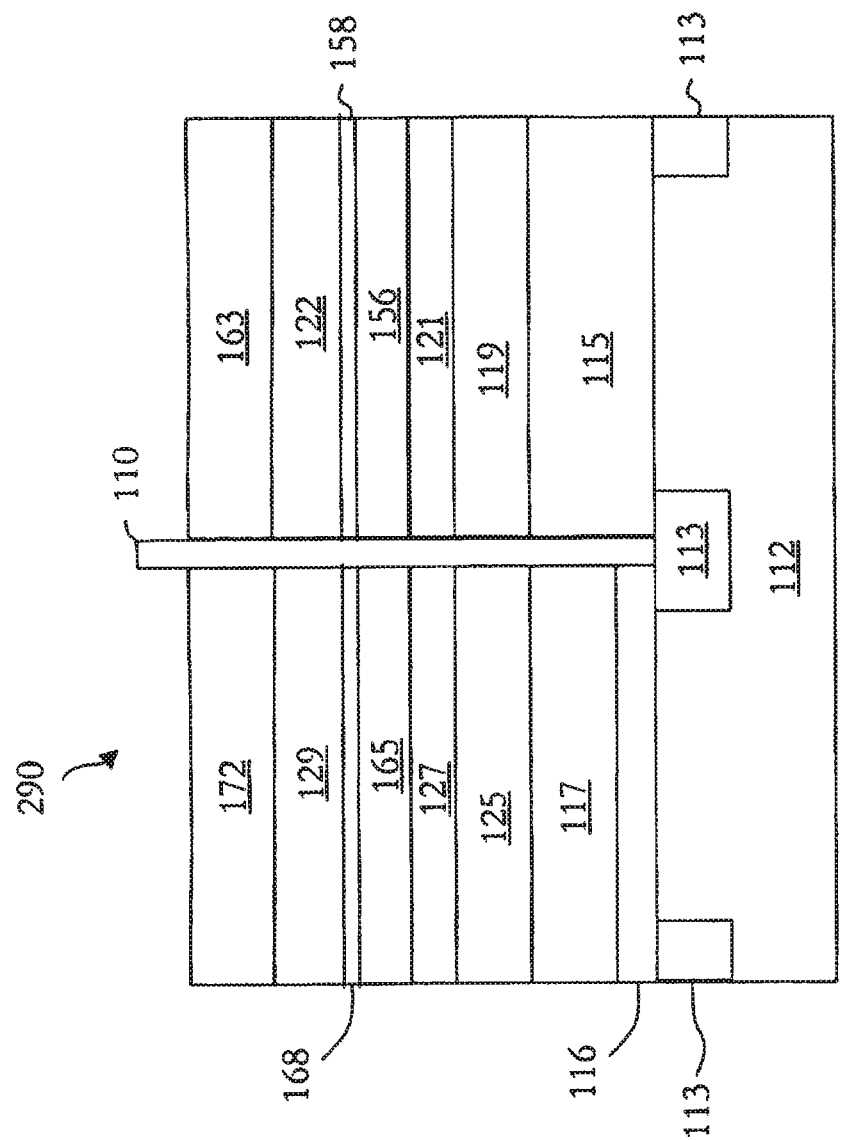
Figure 2T:
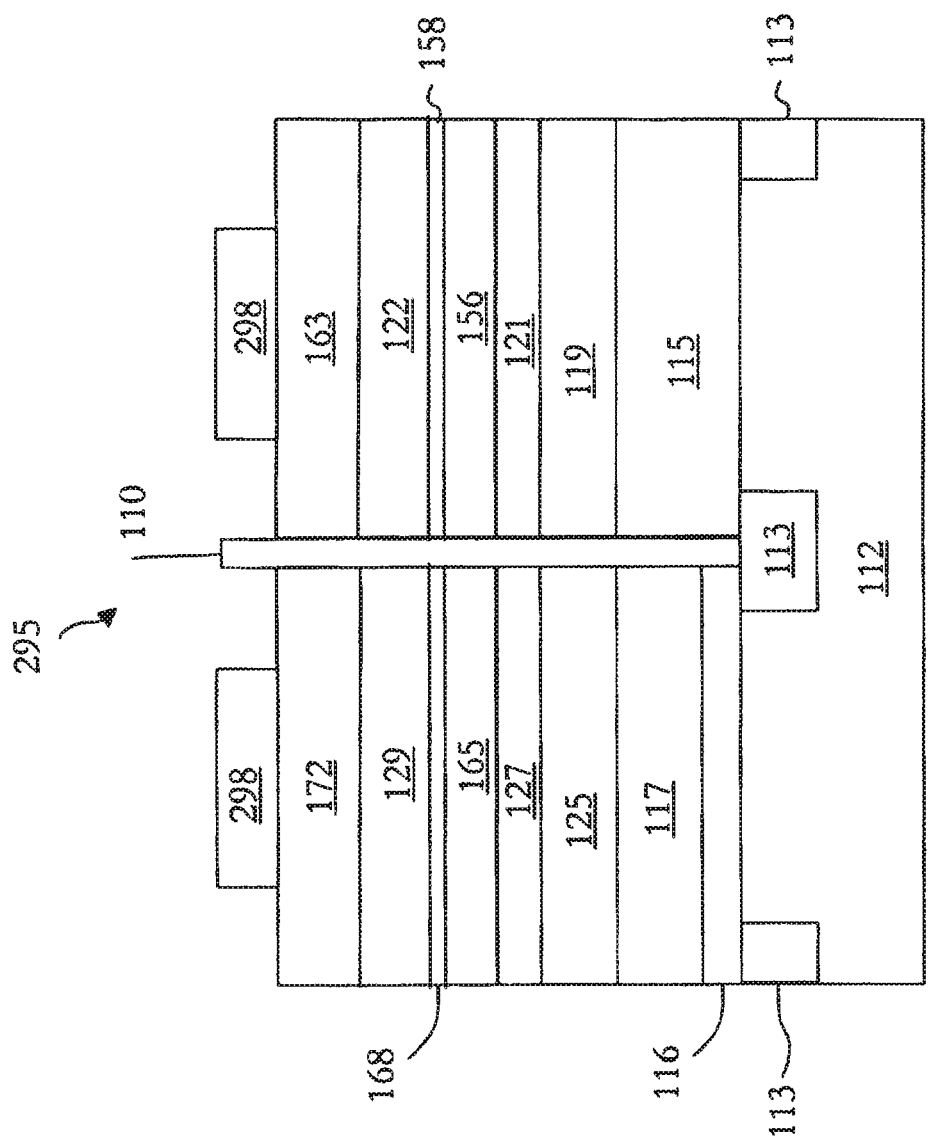
Figure 2U:
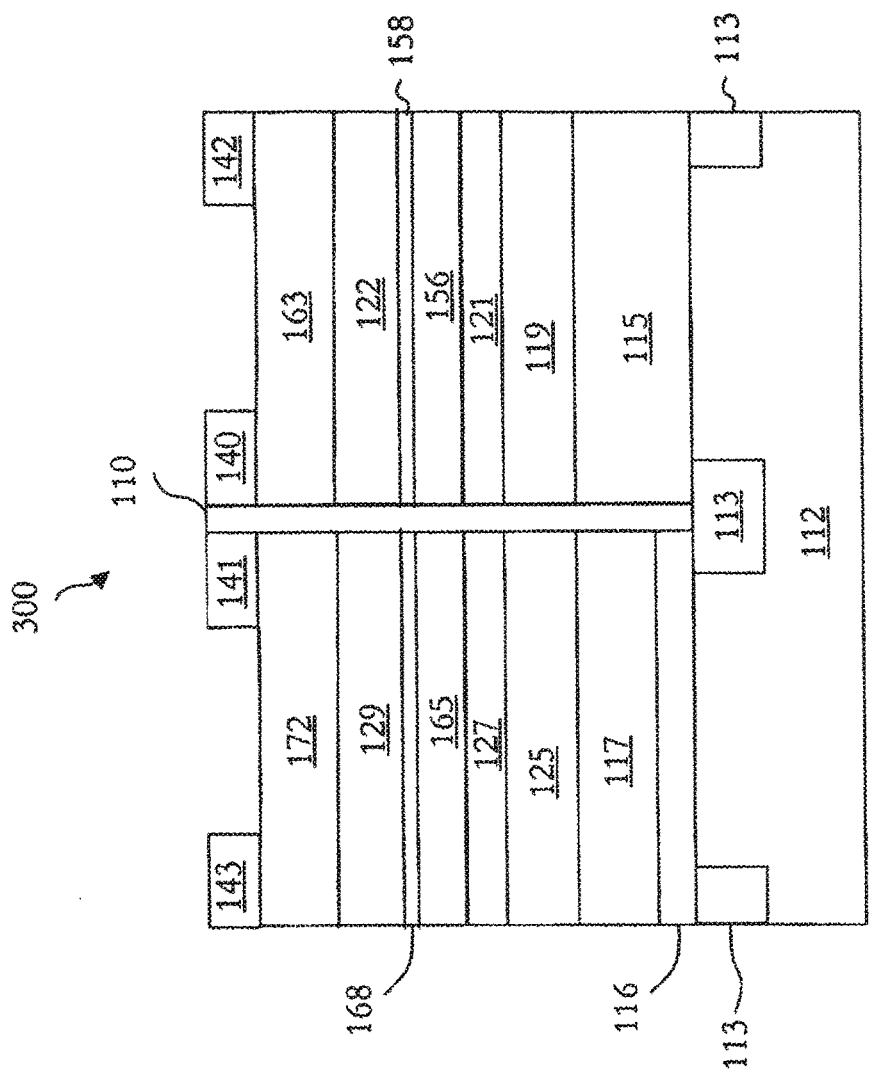

FIG. 2S shows a cross section 290 of the CMOS device 100 after the new photoresist 247 was removed. FIG. 2T shows a cross sectional view 295 of the CMOS device 295 after photoresist 298 has been selectively formed over the first and second cap layers 163 and 172, respectively. FIG. 2U illustrates a cross sectional view 300 of the CMOS device 100 after the PMOS drain metal contact 140, PMOS source metal contact 142, NMOS drain metal contact 141 and NMOS source metal contact 143 have been formed. In one embodiment, the metal contacts all comprise the same metal and are formed concurrently. In an alternative embodiment, the PMOS contacts 140 and 142, are formed of a silicon contact metal and the NMOS contacts 141 and 143, are formed of a III-V contact metal. In this embodiment, the NMOS contacts and PMOS contacts are formed in separate processes, and an additional masking and etching step are required. In one embodiment, the contacts are annealed after formation. In one embodiment, the contacts are annealed using a low temperature anneal no higher then about 420 degrees C.

Figure 2V:
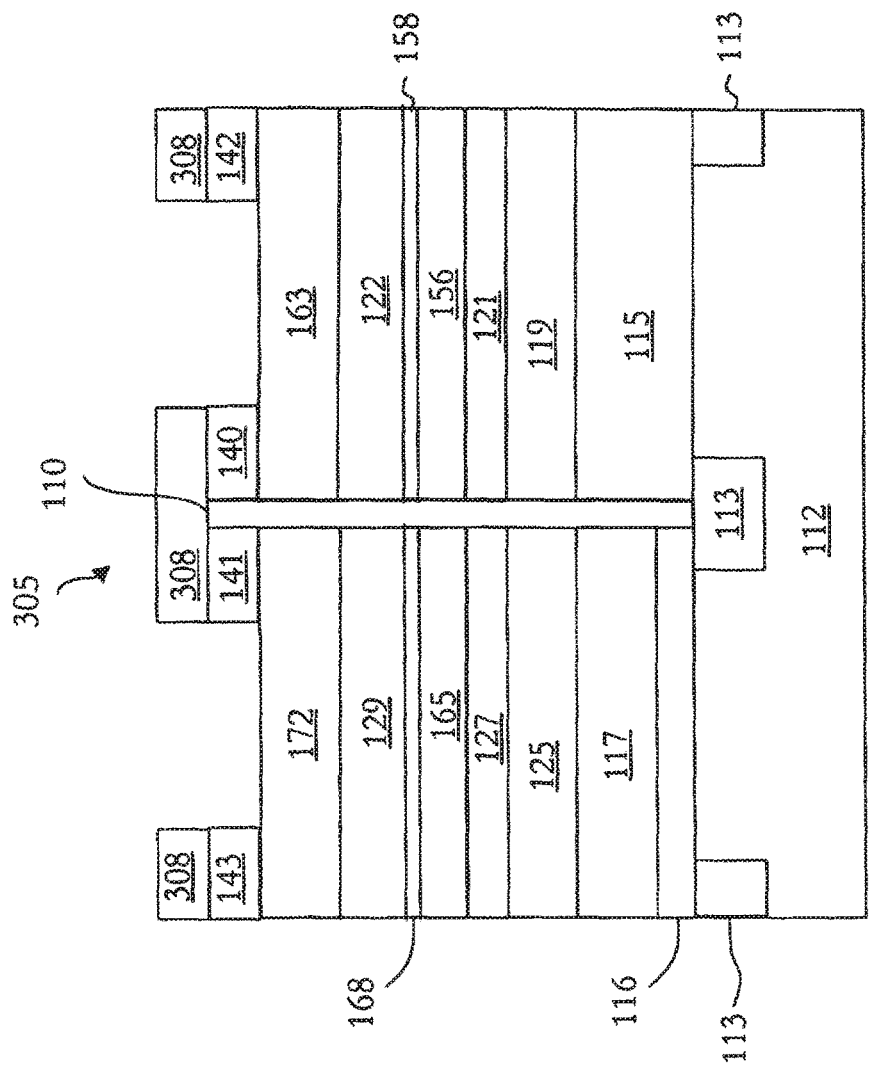
Figure 2W:
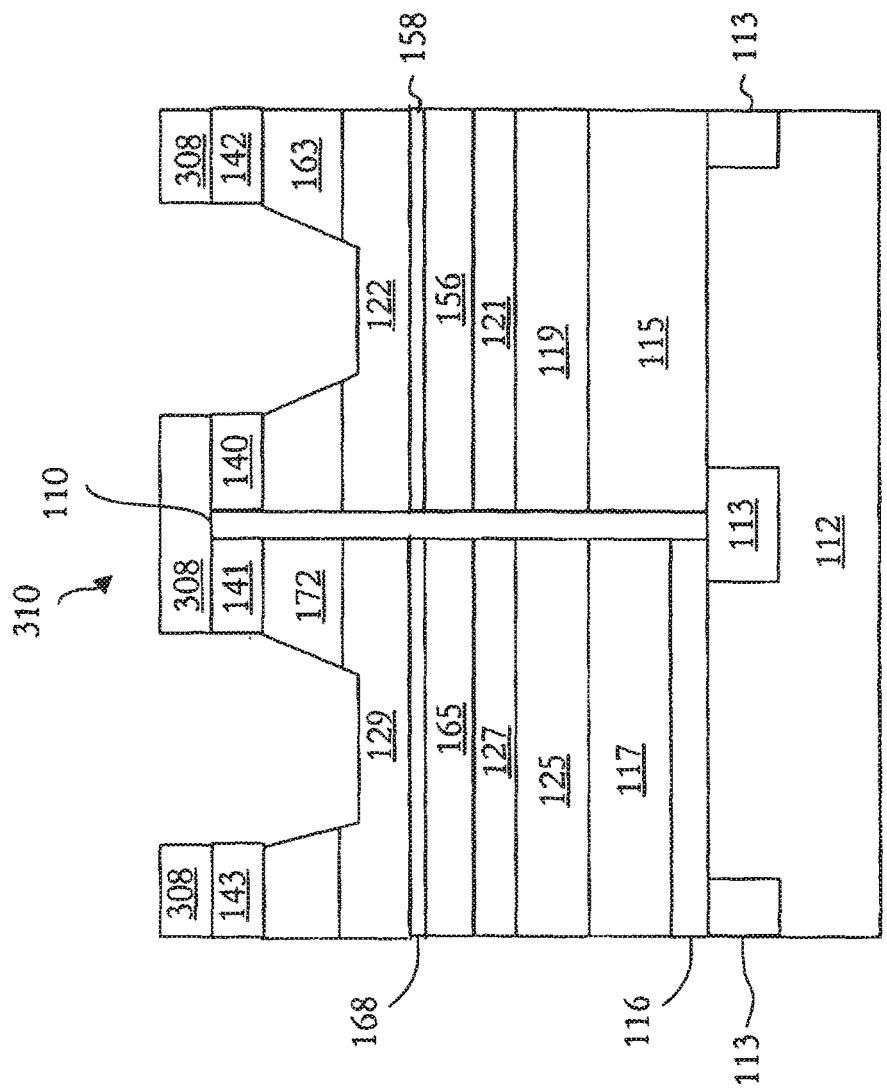

FIG. 2V illustrates a cross sectional view 295 of the CMOS device 305 after formation of a photoresist 308 over the metal contacts. FIG. 2W shows a cross section 310 of the CMOS device 100 after a gate region has been etched into the first top barrier 122 and second top barrier layer 129. The etched regions frame recessed gate areas where recessed gates will be formed. In one embodiment, the etch is performed isotropically. In one embodiment, the etch is performed such that the distance from the surface of the top barrier layers, 122 and 129, to the QW layers, 121 and 127, is about 5-50 nm. In an alternative embodiment, no cap layers are deposited. In this embodiment, the top barrier layers 122 and 129 are etched to frame recessed gate regions. In alternative embodiments, the processes shown and described with regards to FIGS. 2V and 2W may be omitted. When these processes are omitted, recessed gates will not be formed.

Figure 2X:
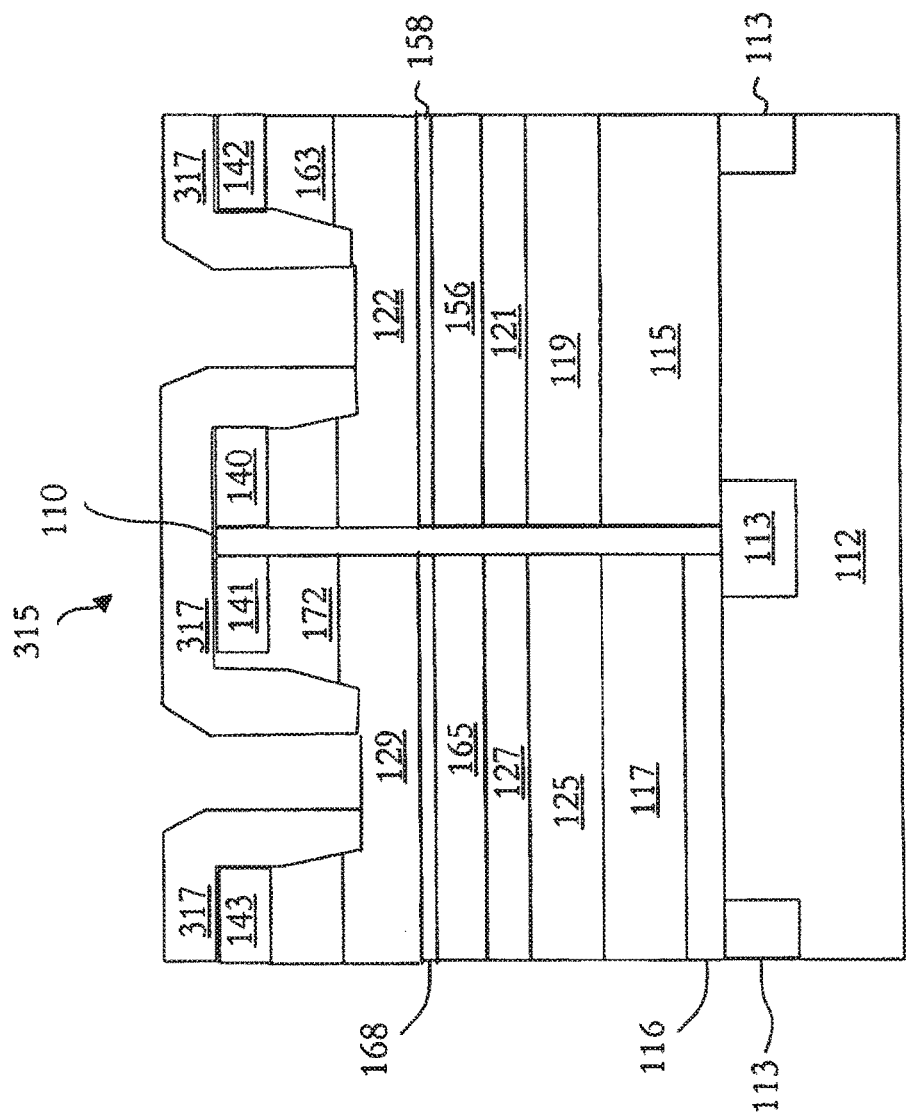
Figure 2Y:
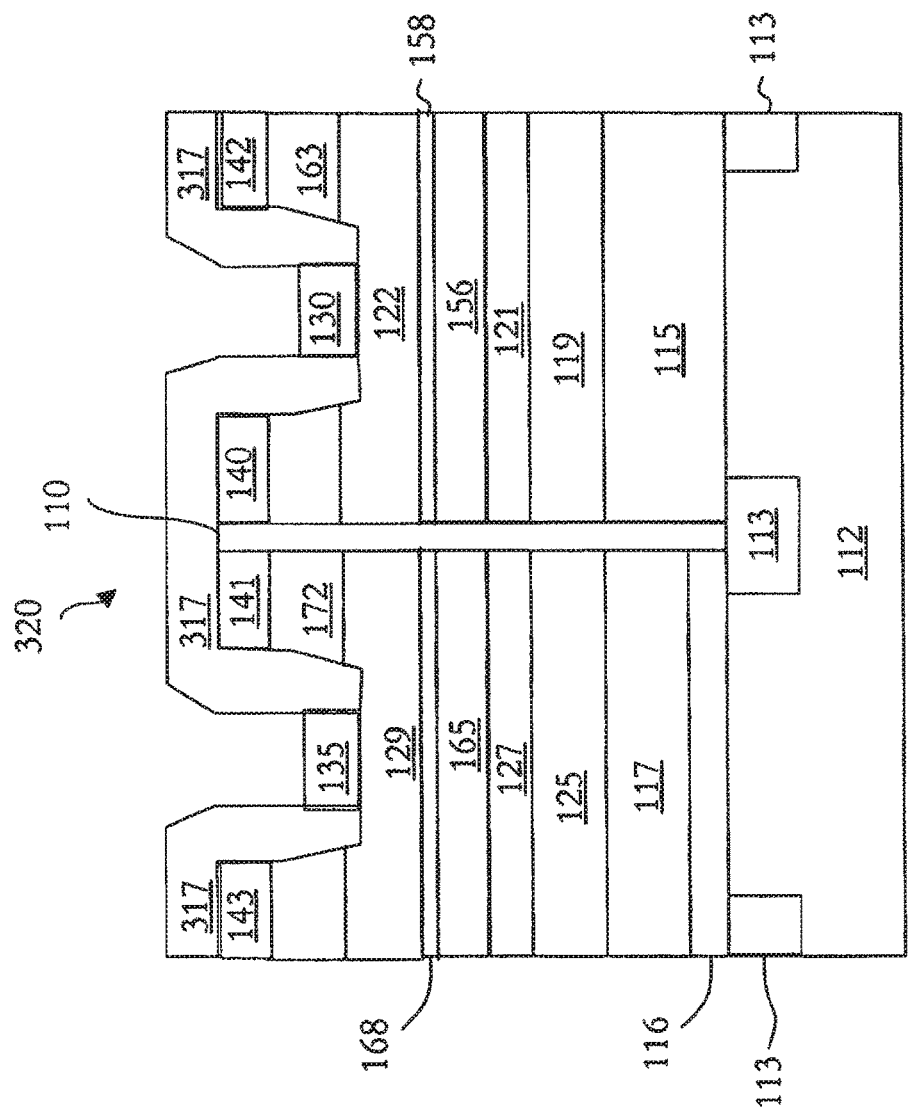

FIG. 2X shows a cross section 315 of the CMOS device 100 after the photoresist 308 has been removed and an additional photoresist 317 has been selectively placed to reveal areas where the gate electrodes will be deposited. FIG. 2Y illustrates a cross section 320 of the CMOS device 100 after a first high-k gate dielectric layer 130 is formed above the first top barrier layer 122 and a second high-k gate dielectric layer 135 is formed above the second top barrier layer 129. In the embodiment shown, the first high-k gate dielectric layer 130 and second high-k gate dielectric layer 135 are formed simultaneously in a single process, such as by CVD or atomic layer deposition (ALD). In an alternative embodiment, the first high-k gate dielectric layer 130 and second high-k gate dielectric layer 135 are formed in separate processes and are composed of different materials from one another. For example, the first high-K gate dielectric can comprise $HfO_2$ and the second high-K gate dielectric can comprise $Al_2O_3$. Where different high-K gate dielectrics are used an additional photolithography masking and etching step may be required.

Figure 2Z:
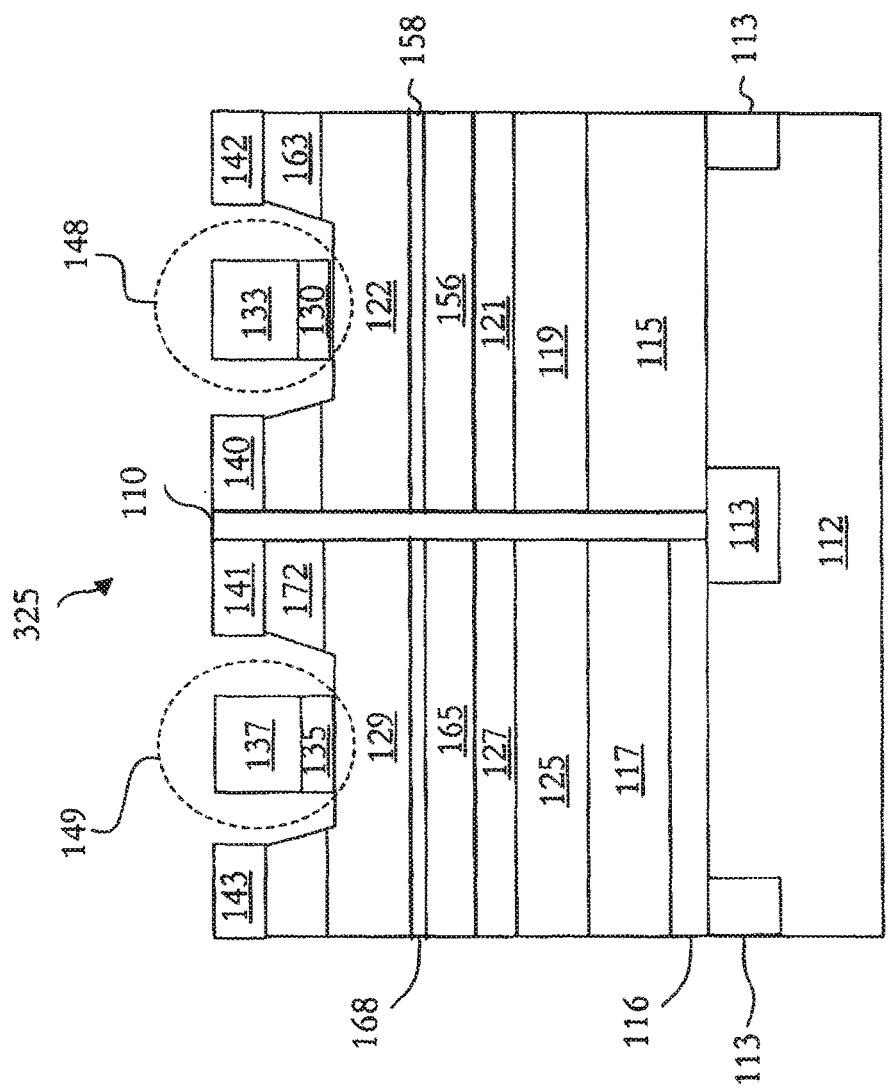

FIG. 2Z illustrates a cross section 325 of the CMOS device 100 after a first metal gate electrode 133 is formed over the first high-k gate dielectric layer 130, and a second metal gate electrode 137 is formed over the second high-k gate dielectric layer 135, and the additional photoresist 317 is removed. The first high-k gate dielectric layer 130 and the first metal gate electrode 133 form a first recessed gate structure 148, and the second high-k gate dielectric layer 135 and the second metal gate electrode 137 form a second recessed gate structure 149. In the illustrated embodiment, the first metal gate electrode 133 and second metal gate electrode 137 can be substantially the same material and are formed simultaneously, such as, for example, by sputtering or physical vapor deposition (PVD) or an e-beam evaporator. In one embodiment, the first metal gate electrode 133 and second metal gate electrode 137 are metal gate electrodes comprising TiN or other mid-gap metals. In alternative embodiments, the first metal gate electrode 133 and second metal gate electrode 137 may comprise different materials and be formed in separate processes. For example, the first metal gate electrode 133 can be a metal gate electrode comprised of a P-type metal such as Al, and the second metal gate electrode 137 can be a metal gate electrode comprised of an N-type metal such as Ti.

Manufacture of the CMOS device is not limited to the sequence of operations illustrated in FIGS. 2A through 2Z. For example, the high-k gate dielectric layers 130 and 135, and the metal gate electrodes 133 and 137, can be formed before the isolation layer 110 and/or the source and drain metal contacts 140 and 142. Additionally, in alternative embodiments, the cap layers, delta doped layers, and spacer layers may be omitted. In some embodiments, etch stop layers may be deposited subsequent to deposition of the top barrier layers.

The foregoing embodiments of the invention have been presented for the purpose of illustration. Although the invention has been described by certain preceding examples, it is not to be construed as being limited by them. They are not intended to be exhaustive, or to limit the scope of the invention. Modifications, improvements and variations within the scope of the invention are possible in light of this disclosure.

What is claimed is:

1. A transistor, comprising:
   a doped silicon semi-insulating substrate;
   a buffer layer disposed above the doped silicon semi-insulating substrate;
   a bottom barrier layer disposed above the buffer layer wherein the bottom barrier layer comprises a material different than the buffer layer;
   a group III-V material quantum well layer disposed above the bottom barrier layer;
   a top barrier layer disposed above the group III-V material quantum well layer;
   a gate stack disposed above the top barrier layer, the gate stack comprising:
      a high-k gate dielectric layer disposed above the top barrier layer; and
      a metal gate electrode disposed above the high-k gate dielectric layer; and
   a semiconductor cap layer on an etch stop layer on the top barrier layer, wherein the gate stack is in an opening through the semiconductor cap layer.

2. The transistor of claim 1, wherein the group III-V material quantum well layer is an indium arsenide (InAs) quantum well layer.

3. The transistor of claim 1, wherein the high-k gate dielectric layer is an aluminum oxide (Al2O3) high-k gate dielectric layer.

4. The transistor of claim 3, wherein the aluminum oxide (Al2O3) high-k gate dielectric layer has a thickness approximately in the range of 1.5-7.5 nanometers.

5. The transistor of claim 1, wherein the metal gate electrode has a gate length approximately in the range of 20-250 nanometers.

6. The transistor of claim 1, wherein the etch stop layer has a thickness approximately in the range of 1-5 nanometers.

7. The transistor of claim 1, wherein the group III-V material quantum well layer has a thickness approximately in the range of 5-30 nanometers.

8. The transistor of claim 1, wherein the buffer layer comprises indium (In) and aluminum (Al).

9. The transistor of claim 1, wherein the metal gate electrode comprises a mid-gap metal.

10. A method of fabricating a transistor, the method comprising:

forming a doped silicon semi-insulating substrate;

forming a buffer layer above the doped silicon semi-insulating substrate;

forming a bottom barrier layer above the buffer layer wherein the bottom barrier layer comprises a material different than the buffer layer;

forming a group III-V material quantum well layer above the bottom barrier layer;

forming a top barrier layer above the group III-V material quantum well layer;

forming an etch stop layer on the top barrier layer;

forming a semiconductor cap layer on the etch stop layer;

forming an opening in the semiconductor cap layer; and forming a gate stack in the opening, forming the gate stack comprising:

forming a high-k gate dielectric layer; and forming a metal gate electrode above the high-k gate dielectric layer.

11. The method of claim 10, wherein forming the group III-V material quantum well layer comprises forming an indium arsenide (InAs) quantum well layer.

12. The method of claim 10, wherein forming the high-k gate dielectric layer comprises forming an aluminum oxide ($Al_2O_3$) high-k gate dielectric layer.

13. The method of claim 12, wherein the aluminum oxide ($Al_2O_3$) high-k gate dielectric layer is formed to a thickness approximately in the range of 1.5-7.5 nanometers.

14. The method of claim 10, wherein the metal gate electrode is formed to a gate length approximately in the range of 20-250 nanometers.

15. The method of claim 10, wherein the etch stop layer is formed to a thickness approximately in the range of 1-5 nanometers.

16. The method of claim 10, wherein the group III-V material quantum well layer is formed to a thickness approximately in the range of 5-30 nanometers.

17. The method of claim 10, wherein forming the buffer layer comprises forming a layer comprising indium (In) and aluminum (Al).

18. The method of claim 10, wherein forming the metal gate electrode comprises forming a mid-gap metal layer.

* * * * *